(12) United States Patent
Ogasawara et al.

(10) Patent No.: US 12,724,345 B2
(45) Date of Patent: Sep. 1, 2026

(54) PHOTOSENSITIVE RESIN COMPOSITION, PHOTOSENSITIVE SHEET, CURED FILM, METHOD FOR PRODUCING CURED FILM, ELECTRONIC COMPONENT, ANTENNA ELEMENT, SEMICONDUCTOR PACKAGE, AND DISPLAY DEVICE

(71) Applicant: TORAY INDUSTRIES, INC., Tokyo (JP)

(72) Inventors: Hisashi Ogasawara, Otsu (JP); Hitoshi Araki, Otsu (JP); Masaya Jukei, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 890 days.

(21) Appl. No.: 17/910,120

(22) PCT Filed: Mar. 12, 2021

(86) PCT No.: PCT/JP2021/010028
§ 371 (c)(1),
(2) Date: Sep. 8, 2022

(87) PCT Pub. No.: WO2021/187355
PCT Pub. Date: Sep. 23, 2021

(65) Prior Publication Data

US 2023/0112804 A1 Apr. 13, 2023

(30) Foreign Application Priority Data

Mar. 18, 2020 (JP) ................................ 2020-047321

(51) Int. Cl.
*G03F 7/028* (2006.01)
*C08G 73/10* (2006.01)
(Continued)

(52) U.S. Cl.
CPC ......... *G03F 7/028* (2013.01); *C08G 73/1053* (2013.01); *G03F 7/037* (2013.01);
(Continued)

(58) Field of Classification Search
CPC .......... G03F 7/028; G03F 7/037; G03F 7/038; G03F 7/0388; G03F 7/004; G03F 7/0387;
(Continued)

(56) References Cited

U.S. PATENT DOCUMENTS

2015/0344627 A1 12/2015 Mizori
2022/0289976 A1* 9/2022 Ogasawara ................ C09J 7/35
2022/0380508 A1* 12/2022 Okaniwa ............... H01L 23/293

FOREIGN PATENT DOCUMENTS

JP 2009211451 A * 9/2009
JP 2009-251451 A 10/2009
(Continued)

OTHER PUBLICATIONS

Cao et al. Synthesis and properties of fluorinated copolymerized polyimide films. Polímeros: Ciência e Tecnologia, 30(2), e2020017. [online]. [Retrieved online on Oct. 8, 2025]. Retrieved from the internet: <URL:https://www.scielo.br/j/po/a/hcWD5yYTyL56Rq3Sw6VcqZB/?lang=en> (Year: 2020).*
(Continued)

*Primary Examiner* — Sanza L. McClendon
(74) *Attorney, Agent, or Firm* — Birch, Stewart, Kolasch & Birch, LLP

(57) ABSTRACT

The purpose of the present invention is to provide a photosensitive resin composition that yields a cured film having exceptional heat resistance, elongation, chemical resistance, permittivity, and dielectric tangent while being curable under low-temperature heat treatments, the percentage of film remaining after development being exceptional. To solve the above problem, the photosensitive resin composi-
(Continued)

tion of the present invention has the following configuration. Specifically, a photosensitive resin composition that contains a resin (A) and a photopolymerization initiator (B), said resin (A): containing one or more structural units selected from the group consisting of specific structural units represented by formula (1), formula (3), and formula (5); and also containing one or more structural units selected from the group consisting of structural units represented by formula (2), formula (4), and formula (6).

21 Claims, 4 Drawing Sheets

(51) Int. Cl.

| | |
|---|---|
| ***G03F 7/037*** | (2006.01) |
| ***G03F 7/038*** | (2006.01) |
| ***H01Q 9/04*** | (2006.01) |
| ***H10W 70/69*** | (2026.01) |
| ***H10W 74/47*** | (2026.01) |
| *H10W 70/05* | (2026.01) |
| *H10W 70/60* | (2026.01) |
| *H10W 70/652* | (2026.01) |
| *H10W 70/66* | (2026.01) |
| *H10W 70/685* | (2026.01) |
| *H10W 72/00* | (2026.01) |
| *H10W 72/20* | (2026.01) |
| *H10W 72/29* | (2026.01) |
| *H10W 72/90* | (2026.01) |
| *H10W 74/10* | (2026.01) |

(52) U.S. Cl.
CPC .......... *G03F 7/038* (2013.01); *H01Q 9/0407* (2013.01); *H10W 70/69* (2026.01); *H10W 74/47* (2026.01); *H10W 70/05* (2026.01); *H10W 70/60* (2026.01); *H10W 70/652* (2026.01); *H10W 70/66* (2026.01); *H10W 70/685* (2026.01); *H10W 72/01935* (2026.01); *H10W 72/242* (2026.01); *H10W 72/29* (2026.01); *H10W 72/90* (2026.01); *H10W 72/9223* (2026.01); *H10W 72/923* (2026.01); *H10W 72/942* (2026.01); *H10W 72/952* (2026.01); *H10W 74/147* (2026.01)

(58) Field of Classification Search
CPC ......... G03F 7/20; G03F 7/26; C08G 73/1053; C08G 18/8116; C08G 73/1017; C08G 73/1039; C08G 73/1042; C08G 73/1071; C08G 73/1082; C08G 73/22; C08G 73/12; H01Q 9/0407; H01Q 1/2283; H01Q 1/364; H01Q 9/045; H01Q 7/00; H01Q 9/065; H01Q 9/40; H10W 70/69; H10W 74/47; H10W 70/05; H10W 70/60; H10W 70/652; H10W 70/66; H10W 70/685; H10W 72/01935; H10W 72/242; H10W 72/29; H10W 72/90; H10W 72/9223; H10W 72/923; H10W 72/942; H10W 72/952; H10W 74/147; H10W 70/695; H10W 90/701
See application file for complete search history.

(56) References Cited

FOREIGN PATENT DOCUMENTS

| | | |
|---|---|---|
| JP | 2010256532 A * | 11/2010 |
| JP | 2010266814 A * | 11/2010 |

OTHER PUBLICATIONS

International Search Report, issued in PCT/JP2021/010028, PCT/ISA/210, dated Jun. 1, 2021.
Written Opinion of the International Searching Authority, issued in PCT/JP2021/010028, PCT/ISA/237, dated Jun. 1, 2021.

* cited by examiner

PHOTOSENSITIVE RESIN COMPOSITION, PHOTOSENSITIVE SHEET, CURED FILM, METHOD FOR PRODUCING CURED FILM, ELECTRONIC COMPONENT, ANTENNA ELEMENT, SEMICONDUCTOR PACKAGE, AND DISPLAY DEVICE

TECHNICAL FIELD

The present invention relates to a photosensitive resin composition, a photosensitive sheet, a cured film, a production method for a cured film, an antenna element, a semiconductor package, an electronic component, and a display device. More specifically, it relates to a photosensitive resin composition that can be suitably used in a surface protection film and interlayer insulating film of an electronic component such as a semiconductor device, an insulating layer of an organic EL element, and the like.

BACKGROUND ART

Having high heat resistance and good electrical insulation properties, polyimide based resins have been used as major material for surface protection films and interlayer insulating films of semiconductor devices, insulating layers of organic electrolytic elements, flattening films of TFT substrates, and the like. In addition, with the aim of improving their productivity, investigations have also been made for photosensitive polyimides having negative photosensitivity and precursors therefor.

In recent years, along with the expansion of applications and performance improvement of semiconductors, efforts have been made to develop more efficient manufacturing processes aiming to achieve reduced cost and increased integration. Under such circumstances, attention has been focused on semiconductor devices that have multiple metal redistribution layers. The insulating films used in these multiple metal redistribution layers are now required to have a lower dielectric constant to achieve increased integration. For high-frequency communication devices designed to perform high-speed wireless communication, furthermore, insulating films with a reduced dissipation factor are called for to achieve reduced transmittance losses. Molding resins have been in wider use in recent years for the manufacturing of memory devices and semiconductor packages, but they are vulnerable to high-temperature processes. To overcome this problem, there are growing expectations for polyimide based resins and polybenzoxazole based resins as materials for surface protection films and interlayer insulating films because they have good mechanical properties, good thermal characteristics, and high chemical resistance and can be cured by heating at low temperatures of 250° C. or less, more favorably 220° C. or less.

Expected materials that are lower in dielectric constant and dissipation factor include a photosensitive resin composition containing a polyimide precursor prepared by introducing a specific chemical structure into a part of the side chain (Patent document 1) and a soluble polyimide produced from dimer diamine (Patent document 2). As resin compositions that can be cured at low temperatures, there have been proposals of resin compositions that contain resins such as polyimide, polybenzoxazole, polybenzoimidazole, and polybenzothiazole together with a heat-crosslinker (Patent document 3).

PRIOR ART DOCUMENTS

Patent Documents

Patent document 1: International Publication WO 2019/044874

Patent document 2: Japanese Unexamined Patent Publication (Kokai) No. 2018-203959

Patent document 3: Japanese Unexamined Patent Publication (Kokai) No. 2007-16214

SUMMARY OF INVENTION

Problems to be Solved by the Invention

In cases where conventional technology is applied to the production of multilayer wiring insulating films designed for high frequency communication devices to perform high speed wireless communication, imide cyclization fails to proceed to a required degree when curing is performed at a low temperature and it leads to insufficient chemical resistance and mechanical properties as seen in Patent document 1 for example. In Patent document 2, the backbone, which is derived from a dimer diamine, is so flexible that it is impossible to achieve a sufficient heat resistance or a sufficient residual film percentage after development, and in Patent document 3, there occur problems due to a large dielectric constant and dissipation factor.

Means of Solving the Problems

To solve the above problems, the present invention is as described below.

(1) A photosensitive resin composition including a resin (A1) and a photopolymerization initiator (B), the resin (A1) having a structural unit as represented by the general formula (17), having an ethylenically unsaturated bond, and containing at least one selected from the group consisting of polyimide, polybenzoxazole, a precursor therefor, and a copolymer thereof, and the precursor maintaining a bond derived from the ethylenically unsaturated bond after being converted into an imide or an oxazole.

[Chemical compound 1]

(17)

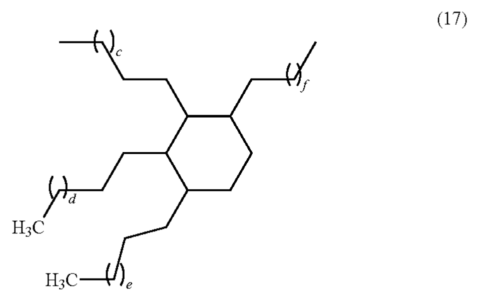

In the formula (17), c, d, e, and f are integers of 1 or more and satisfy the relations c+d=6 to 17 and e+f=8 to 19, and each broken line represents either a carbon-carbon single bond or a carbon-carbon double bond.

(2) A photosensitive resin composition including a resin (A2) and a photopolymerization initiator (B), the resin (A2) having at least a structural unit as represented by the formula (18), (19), or (20) and having a structural unit as represented by the formula (17).

[Chemical compound 2]

(17)

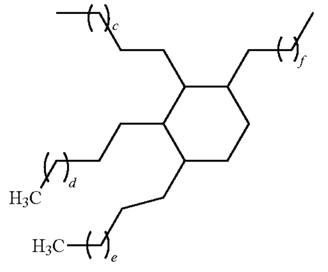

In the formula (17), c, d, e, and f are integers of 1 or more and satisfy the relations c+d=6 to 17 and e+f=8 to 19, and each broken line represents either a carbon-carbon single bond or a carbon-carbon double bond.

[Chemical compound 3]

[Chemical compound 3]

(18)

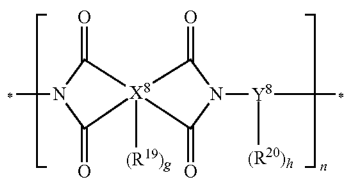

In the formula (18), $X^8$ denotes a tetravalent to hexavalent organic group containing 2 to 60 carbon atoms; $Y^8$ denotes a divalent to hexavalent organic group containing 2 to 70 carbon atoms; $R^{19}$'s and $R^{20}$'s each independently denote a carboxyl group, a hydroxyl group, or a monovalent organic group containing 3 to 30 carbon atoms and having an ethylenically unsaturated bond; at least one of $R^{19}$'s and $R^{20}$'s is a monovalent organic group containing 3 to 30 carbon atoms and having an ethylenically unsaturated bond; g denotes an integer of 0 to 2; h denotes an integer of 0 to 4; the relation 1≤g+h≤6 holds; and * denotes a bonding point.

[Chemical compound 4]

[Chemical compound 4]

(19)

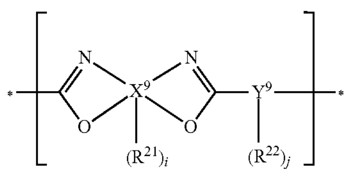

In the formula (19), $X^9$ denotes a tetravalent to hexavalent organic group containing 2 to 60 carbon atoms; $Y^9$ denotes a divalent to hexavalent organic group containing 2 to 70 carbon atoms; $R^{21}$'s and $R^{22}$'s may be identical to or different from each other and each independently denote a carboxyl group, a hydroxyl group, or a monovalent organic group containing 3 to 30 carbon atoms and having an ethylenically unsaturated bond; at least one of $R^{21}$'s and $R^{22}$'s is a monovalent organic group containing 3 to 30 carbon atoms and having an ethylenically unsaturated bond; i denotes an integer of 0 to 2; j denotes an integer of 0 to 4; the relation 1≤i+j≤6 holds, and * denotes a bonding point.

[Chemical compound 5]

[Chemical compound 5]

(20)

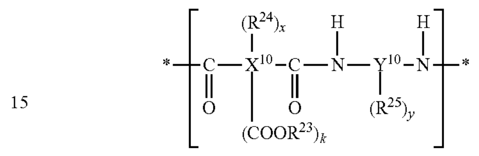

In the formula (20), $X^{10}$ denotes a tetravalent to hexavalent organic group containing 2 to 60 carbon atoms; $Y^{10}$ denotes a divalent to hexavalent organic group containing 2 to 70 carbon atoms; ($COOR^{23}$) is a substituent group located at a position where it can form an imide ring with an amide group bonded to $X^{10}$; $R^{23}$ is a hydrogen atom or an organic group containing 1 to 5 carbon atoms; $R^{24}$ is a hydroxyl group or a monovalent organic group containing 3 to 30 carbon atoms and having an ethylenically unsaturated bond; $R^{25}$ is a carboxyl group, a hydroxyl group, or a monovalent organic group containing 3 to 30 carbon atoms and having an ethylenically unsaturated bond; at least one of $R^{24}$'s and $R^{25}$'s is a monovalent organic group containing 3 to 30 carbon atoms and having an ethylenically unsaturated bond; k denotes an integer of 0 to 2; x denotes an integer of 0 to 2, y denotes an integer of 0 to 4; the relation 1≤x+y≤6 holds; and * denotes a bonding point.

(3) A photosensitive resin composition including a resin (A3) and a photopolymerization initiator (B), the resin (A3) containing one or more structural units selected from those represented by any of the formula (1), formula (3), and formula (5) and further containing one or more structural units selected from those represented by any of the formula (2), formula (4), and formula (6).

[Chemical compound 6]

[Chemical compound 6]

(1)

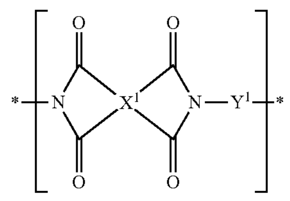

In the formula (1), $X^1$ denotes a tetravalent organic group containing 2 to 60 carbon atoms; $Y^1$ denotes a divalent organic group containing 2 to 70 carbon atoms; at least either $X^1$ or $Y^1$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point.

[Chemical compound 7]

(2)

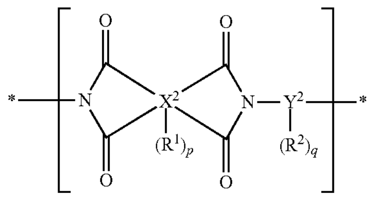

In the formula (2), $X^2$ denotes a tetravalent to hexavalent organic group containing 2 to 60 carbon atoms; $Y^2$ denotes a divalent to hexavalent organic group containing 2 to 70 carbon atoms; $R^1$'s and $R^2$'s each independently denote a carboxyl group, a hydroxyl group, or a monovalent organic group containing 3 to 30 carbon atoms and having an ethylenically unsaturated bond; at least one of $R^1$'s and $R^2$'s is a monovalent organic group containing 3 to 30 carbon atoms and having an ethylenically unsaturated bond; p denotes an integer of 0 to 2; q denotes an integer of 0 to 4; the relation $1 \leq p+q \leq 6$ holds; and * denotes a bonding point.

[Chemical compound 8]
[Chemical compound 8]

(3)

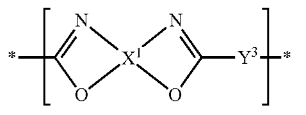

In the formula (3), $X^3$ denotes a tetravalent organic group containing 2 to 60 carbon atoms; $Y^3$ denotes a divalent organic group containing 2 to 70 carbon atoms; at least either $X^3$ or $Y^3$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point.

[Chemical compound 9]

(4)

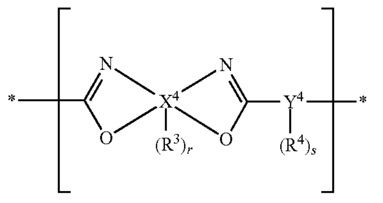

In the formula (4), $X^4$ denotes a tetravalent to hexavalent organic group containing 2 to 60 carbon atoms; $Y^4$ denotes a divalent to hexavalent organic group containing 2 to 70 carbon atoms; $R^3$'s and $R^4$'s may be identical to or different from each other and each independently denote a carboxyl group, a hydroxyl group, or a monovalent organic group containing 3 to 30 carbon atoms and having an ethylenically unsaturated bond; at least one of $R^3$'s and $R^4$'s is a monovalent organic group containing 3 to 30 carbon atoms and having an ethylenically unsaturated bond; r denotes an integer of 0 to 2; s denotes an integer of 0 to 4; the relation $1 \leq r+s \leq 6$ holds, and * denotes a bonding point.

[Chemical compound 10]

(5)

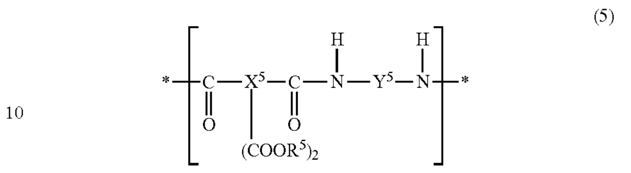

In the formula (5), $X^5$ denotes a tetravalent organic group containing 2 to 60 carbon atoms; $Y^5$ denotes a divalent organic group containing 2 to 70 carbon atoms; at least either $X^5$ or $Y^5$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; ($COOR^5$) is a substituent group located at a position where it can form an imide ring with an amide group bonded to $X^5$; $R^5$ denotes a hydrogen atom or an organic group containing 1 to 5 carbon atoms; and * denotes a bonding point.

[Chemical compound 11]

(6)

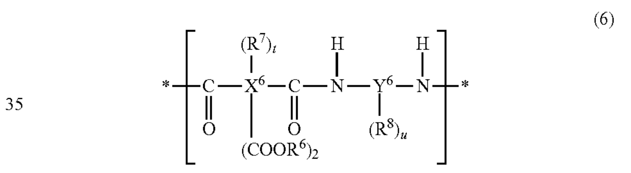

In the formula (6), $X^6$ denotes a tetravalent to hexavalent organic group containing 2 to 60 carbon atoms; $Y^6$ denotes a divalent to hexavalent organic group containing 2 to 70 carbon atoms; ($COOR^6$) is a substituent group located at a position where it can form an imide ring with an amide group bonded to $X^6$; $R^6$ is a hydrogen atom or an organic group containing 1 to 5 carbon atoms; $R^7$ is a hydroxyl group or a monovalent organic group containing 3 to 30 carbon atoms and having an ethylenically unsaturated bond; $R^8$ is a carboxyl group, a hydroxyl group, or a monovalent organic group containing 3 to 30 carbon atoms and having an ethylenically unsaturated bond; at least one of $R^7$'s and $R^8$'s contains 3 to 30 carbon atoms and having an ethylenically unsaturated bond; t denotes an integer of 0 to 2; u denotes an integer of 0 to 4; the relation $1 \leq t+u \leq 6$ holds; and * denotes a bonding point.

Advantageous Effects of the Invention

The photosensitive resin composition according to the present invention has a high residual film percentage after development. In addition, it gives a cured film having a heat resistance, chemical resistance, dielectric constant, and dissipation factor.

DESCRIPTION OF PREFERRED EMBODIMENTS

Figure 1:
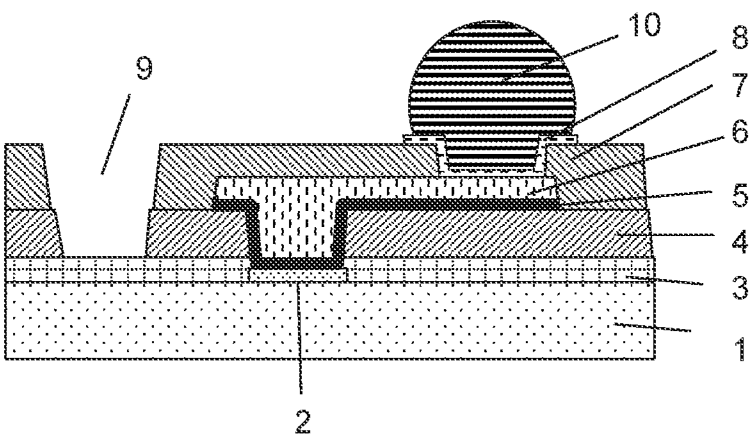
FIG. 1 This is an enlarged cross-sectional view of a pad portion of a bumped semiconductor device.

The photosensitive resin composition according to the present invention includes a resin (A1) (hereinafter occasionally referred to as the component (A1)) and a photopolymerization initiator (B) (hereinafter occasionally referred to as the component (B)), wherein the resin (A1) contains at least one selected from the group consisting of polyimide, polybenzoxazole, a precursor therefor, and a copolymer thereof, has a structural unit as represented by the general formula (17), and has an ethylenically unsaturated bond, and the precursor maintains a bond derived from the ethylenically unsaturated bond after being converted into an imide or an oxazole.

[Chemical compound 12]

(17)

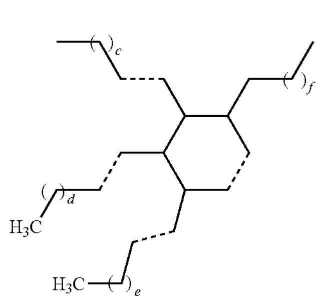

In the formula (17), c, d, e, and f are integers of 1 or more and satisfy the relations c+d=6 to 17 and e+f=8 to 19, and each broken line represents either a carbon-carbon single bond or a carbon-carbon double bond.

Here, in the present Description, a range defined by two values with "to" in between includes the values at the upper and lower ends unless specified otherwise.

Polyimide and polybenzoxazole are resins having a cyclic structure, namely an imide ring and an oxazole ring, respectively, in the backbone chain structures. Furthermore, their precursors, namely, a polyimide precursor and a polybenzoxazole precursor, are resins that form an imide ring structure and a benzoxazole ring structure, respectively, when dehydrated and cycized.

Polyimide can be produced by reacting a tetracarboxylic acid, a tetracarboxylic dianhydride, or a tetracarboxylic acid diester dichloride with a diamine, a diisocyanate compound, or a trimethylsilylated diamine, and contains a tetracarboxylic acid residue and a diamine residue. For instance, polyimide can be produced by subjecting a polyamic ad, which is a polyimide precursor formed through reaction of a tetracarboxylic dianhydride and a diamine, to heat treatment to undergo dehydration and cyclization. A solvent azeotropic with water, such as m-xylene, may be added in this heat treatment step. As another method, a dehydration condensation agent such as carboxylic anhydride and dicyclohexyl carbodiimide and a base such as triethyl amine that works as a cyclization catalyst may be added, followed by chemical heat treatment to cause dehydration and cyization. It is also a good method to add a weakly acidic carboxylic acid compound and heat treatment is performed at a low temperature of 100° C. or less to cause dehydration and cyclization.

Furthermore, a copolymer can be produced by controlling the reaction time appropriately in the dehydration and cyclization step or by polymerizing the resulting polyimide continuously with polyamic acid.

A generally known substance may be used as the tetracarboxylic dianhydride. Good examples thereof include butanetetracarboxylic dianhydride, cyclopentanetetracarboxylic dianhydride, pyromellitic dianhydride, bicyclohexanetetracarboxylic dianhydride, pentanetetracarboxylic dianhydride, hexanetetracarboxylic dianhydride, cyclopropanetetracarboxylic dianhydride, cyclobutanetetracarboxylic dianhydride, cyclopentanetetracarboxylic dianhydride, cyclohexanetetracarboxylic dianhydride, 3,3',4,4'-benzophenonetetracarboxylic dianhydride, 3,3',4,4'-diphenylsulfonetetracarboxylic dianhydride, 4,4'-oxydiphthalic anhydride, P-phenylene-bis(trimellitate anhydride), ethyleneglycol-bisanhydrotrimellitate, and 4,4'-(hexafluoroisopropylidene)diphthalic anhydride. These compounds may be used singly or in combination of two or more thereof.

A generally known substance may be used as the diamine. Good examples thereof include, but not limited to, 4,4'-diaminodiphenylether, 4,4'-diaminodiphenylmethane, 4,4'-diaminodiphenylsulfone, 4,4'-diaminodiphenylsulflde, m-phenylenediamine, p-phenylenediamine, 2,4-diaminotoluene, 2,5-diaminotoluene, 2,6-diaminotoluene, benzidine, 3,3'-dimethylbenzidine, 3,3'-dimethoxybenzidine, o-tolidine, 4,4"-diaminoterphenyl, 1,5-diaminonaphthalene, 2,5-diaminopyridine, 3,3'-dimethyl-4,4'-diaminodiphenylmethane, 4,4'-bis(p-aminophenoxy)biphenyl, 2,2-bis[4-(p-aminophenoxy)phenyl]propane, and hexahydro-4,7-metamethanoindanylene dimethylene diamine. These compounds may be used singly or in combination of two or more thereof.

Polybenzooxazole can be produced by reacting a bisaminophenol compound with a dicarboxylic acid, dicarboxylic acid chloride, or dicarboxylic acid active ester, and contains a dicarboxylic acid residue and a bisaminophenol residue. For instance, polybenzoxazole can be produced by subjecting polyhydroxyamide, which is a polybenzoxazole precursor formed through reaction of a bisaminophenol compound and a dicarboxylic acid, to heat treatment to undergo dehydration and cyclization. Or, it can also be produced by adding a phosphoric anhydride, a base, a carbodiimide compound, or the like, followed by chemical treatment to cause dehydration and cyclization.

Furthermore, a copolymer can be produced by controlling the reaction time appropriately in the dehydration and cyclization step or by polymerizing the resulting polybenzoxazole continuously with polyhydroxyamide.

A generally known substance may be used as the dicarboxylic acid. Good examples include terephthalic acid, isophthalic acid, diphenyl ether dicarboxylic acid, bis(carboxyphenyl) hexafluoropropane, biphenyldicarboxylic acid, benzophenonedicarboxylic acid, and triphenyldicarboxylic acid, and examples of tricarboxylic acids include trimellitic acid, trimesic acid, diphenyl ether tricarboxylic acid, and biphenyltricarboxylic acid. These compounds may be used singly or in combination of two or more thereof.

A generally known substance may be used as the bisaminophenol compound. Good examples thereof include, but not limited to, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, and 2,2-bis(4-amino-3-hydroxyphenyl)-1,1,1,3,3,3-hexafluoropropane. These compounds may be used singly or in combination of two or more thereof.

In addition, if a tracarboxylic dianhydride, dicarboxylic acid, and diamine are used in combination, it is possible to produce a copolymer containing two or more of a polyimide, polybenzoxazole, polyimide precursor, and polybenzoxazole precursor.

Such a precursor maintains a bond derived from the ethylenically unsaturated bond after being converted into an imide or an oxazole. Because of the existence of an ethylenically unsaturated bond after the conversion into an imide or an oxazole, a higher heat resistance can be developed as a result of crosslinking between resins during the curing step.

To introduce an ethylenically unsaturated bond into a resin, there are generally known useful methods such as a process in which a hydroxyl group and/or carboxyl group in a resin is reacted with a compound having an ethylenically unsaturated double bond group and a process in which a resin is produced by polymerizing monomers having ethylenically unsaturated bonds. From the viewpoint of reactivity, such a compound having an ethylenically unsaturated double bond group is preferably an electrophilic compound having an ethylenically unsaturated double bond group.

Examples of such an electrophilic compound include isocyanate compounds, isothiocyanate compounds, epoxy compounds, aldehyde compounds, thioaldehyde compounds, ketone compounds, thioketone compounds, acetate compounds, carboxylic acid chlorides, carboxylic anhydrides, carboxylic acid active ester compounds, carboxylic acid compounds, alkyl halide compounds, alkyl azide compounds, alkyl triflate compounds, alkyl mesylate compounds, alkyl tosylate compounds, and alkyl cyanide compounds, of which isocyanate compounds, epoxy compounds, aldehyde compounds, ketone compounds, and carboxylic anhydrides are preferable, and isocyanate compounds, epoxy compounds, and carboxylic anhydrides are more preferable, from the viewpoint of reactivity and applicability of the compounds.

A polymerization inhibitor may be added in a small amount in order to prevent the ethylenically unsaturated bonds from crosslinking during the reaction. Good polymerization inhibitors include phenol compounds such as hydroquinone, 4-methoxyphenol, t-butylpyrocatechol, and bis-t-butylhydroxytoluene. The quantity of the polymerization inhibitor to be added is preferably such that the phenolic hydroxyl group in the polymerization inhibitor accounts for 0.1 mol % or more and 5 mol % or less relative to the ethylenically unsaturated bonds in alcohols.

A structure as represented by the formula (17) has the backbone of a dimer acid that is in the form of a dimer of an unsaturated fatty acid such as linoleic acid and oleic acid, and from the viewpoint of giving a cured film with high reliability, it is preferable for the structure not to contain a double bond.

Specific examples of a diamine having a structure as represented by the formula (17) include commercial products of dimer diamines such as Versamine (registered trademark) 551, Versamine (registered trademark) 552, both manufactured by BASF, Priamine (registered trademark) 1073, Priamine (registered trademark) 1074, and Priamine (registered trademark) 1075, all manufactured by Croda Japan K.K. Of these, Versamine (registered trademark) 551 and Priamine (registered trademark) 1074 are dimer diamine compounds containing compounds as represented by the formula (10), whereas Versamine (registered trademark) 552, Priamine (registered trademark) 1073, and Priamine (registered trademark) 1075 are dimer diamine compounds containing compounds as represented by the formula (9).

[Chemcial compound 13]

(10)

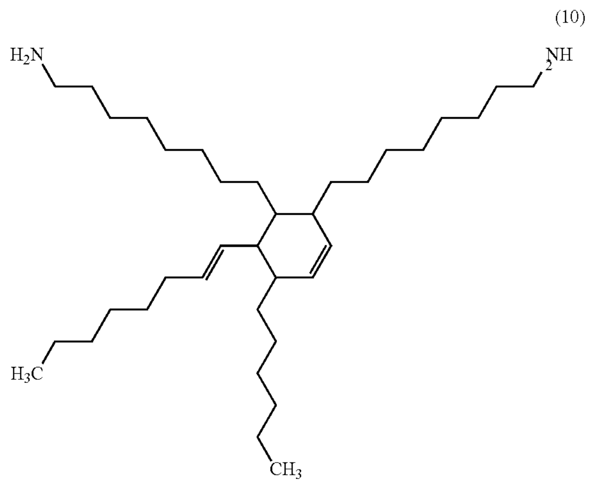

[Chemical compound 14]

(9)

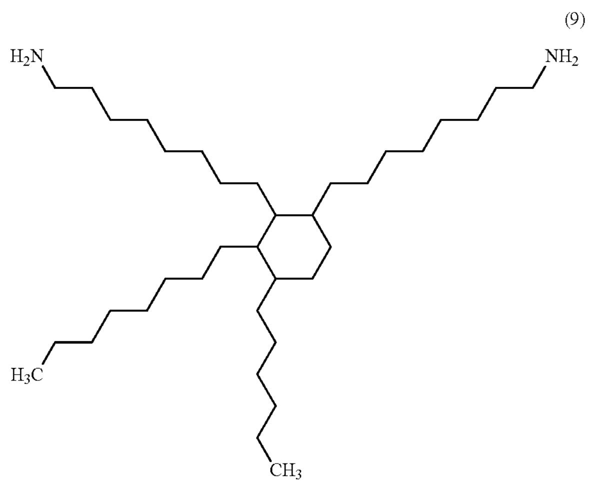

Alternatively, a mixture of a trimer triamine and a dimer diamine may be adopted. Commercial products of trimer triamine and dimer diamine include Priamine (registered trademark) 1071 manufactured by Croda Japan K.K.

Specific examples of a multivalent carboxylic acid having a structure as represented by the formula (17) include Pripol (registered trademark) 1009, Pripol (registered trademark) 1006, Pripol (registered trademark) 1010, Pripol (registered trademark) 1013, Pripol (registered trademark) 1025, Pripol (registered trademark) 1017, Pripol (registered trademark) 1040, and Pripol (registered trademark) 1004, all manufactured by Croda Japan K.K.

Examples of a derivative of a multivalent carboxylic acid having a structure as represented by the formula (17) include products of reaction between dimer diamine and trimellitic anhydride chloride. More specifically, they are represented by the formula (11).

[Chemical compound 15]

(11)

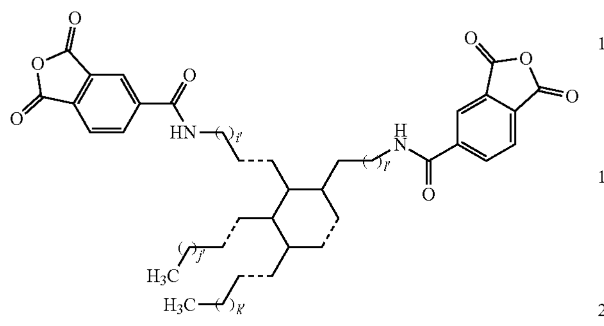

In the formula (11), i', j', k', and l' are each a natural number and satisfy the relations i'+j'=6 to 17 and k'+l'=8 to 19. Each broken line represents either a carbon-carbon single bond or a carbon-carbon double bond.

In the resin (A1), the structural unit represented by the formula (17) preferably accounts for 1 mol % or more and 30 mol % or less, more preferably 1 mol % or more and 15 mol % or less. If the content is 1 mol % or more, it is possible to ensure a lower dielectric constant and a lower dissipation factor. If it is 30 mol % or less, on the other hand, it is possible to ensure a higher heat resistance.

The photosensitive resin composition according to the present invention includes a resin (A2) and a photopolymerization initiator (B), wherein the resin (A2) (hereinafter occasionally referred as the component (A2)) has at least a structural unit as represented by the formula (18), (19), or (20) and has a structural unit as represented by the formula (17).

[Chemical compound 16]

(18)

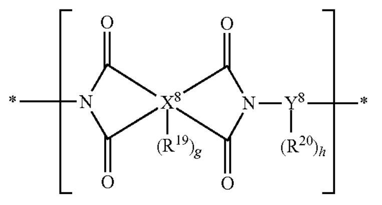

In the formula (18), $X^8$ denotes a tetravalent to hexavalent organic group containing 2 to 60 carbon atoms; $Y^8$ denotes a divalent to hexavalent organic group containing 2 to 70 carbon atoms; $R^{19}$'s and $R^{20}$'s each independently denote a carboxyl group, a hydroxyl group, or a monovalent organic group containing 3 to 30 carbon atoms and having an ethylenically unsaturated bond; at least one of $R^{19}$'s and $R^{20}$'s is a monovalent organic group containing 3 to 30 carbon atoms and having an ethylenically unsaturated bond; g denotes an integer of 0 to 2; h denotes an integer of 0 to 4; the relation $1 \leq g+h \leq 6$ holds; and * denotes a bonding point.

[Chemical compound 17]

(19)

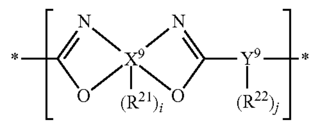

In the formula (19), $X^9$ denotes a tetravalent to hexavalent organic group containing 2 to 60 carbon atoms; $Y^9$ denotes a divalent to hexavalent organic group containing 2 to 70 carbon atoms; $R^{21}$'s and $R^{2}$'s may be identical to or different from each other and each independently denote a carboxyl group, a hydroxyl group, or a monovalent organic group containing 3 to 30 carbon atoms and having an ethylenically unsaturated bond; at least one of $R^{21}$'s and $R^{22}$'s is a monovalent organic group containing 3 to 30 carbon atoms and having an ethylenically unsaturated bond; i denotes an integer of 0 to 2; j denotes an integer of 0 to 4; the relation $1 \leq i+j \leq s$ 6 holds, and * denotes a bonding point.

[Chemical compound 18]

(20)

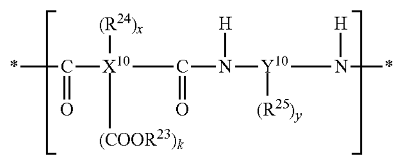

In the formula (20), $X^{10}$ denotes a tetravalent to hexavalent organic group containing 2 to 60 carbon atoms; $Y^{10}$ denotes a divalent to hexavalent organic group containing 2 to 70 carbon atoms; ($COOR^{23}$) is a substituent group located at a position where it can form an imide ring with an amide group bonded to $X^{10}$; $R^{23}$ is a hydrogen atom or an organic group containing 1 to 5 carbon atoms; $R^{24}$ is a hydroxyl group or a monovalent organic group containing 3 to 30 carbon atoms and having an ethylenically unsaturated bond; $R^{25}$ is a carboxyl group, a hydroxyl group, or a monovalent organic group containing 3 to 30 carbon atoms and having an ethylenically unsaturated bond; at least one of $R^{24}$'s and $R^{25}$'s is a monovalent organic group containing 3 to 30 carbon atoms and having an ethylenically unsaturated bond; k denotes an integer of 0 to 2; x denotes an integer of 0 to 2, y denotes an integer of 0 to 4; the relation $1 \leq x+y \leq 6$ holds; and * denotes a bonding point.

An organic group is defined as a group that contains at least one carbon atom and may further contain an oxygen atom, hydrogen atom, fluorine atom, or other atoms as required. In addition, an X-valent organic group is defined as a group that has a chemical structure resulting from the conversion of an organic compound into the form of an X-valent group, and it is a group of atoms formed by removing X hydrogen atoms from an organic compound.

The photosensitive resin composition according to the present invention contains the component (A2), and when cured, this allows the photosensitive resin composition according to the present invention to form a cured film according to the present invention, which has a low dielectric constant and a low dissipation factor.

In the formula (18), formula (19), and formula (20), $X^8$, $X^9$, and $X^{10}$ each denote a tetravalent organic group containing 2 to 60 carbon atoms and are each a residue of an acid component. Examples of such an acid component include tetracarboxylic acid, tetracarboxylic dianhydride, and tetracarboxylic acid diester dichloride.

$Y^8$, $Y^9$, and $Y^{10}$ each denote a divalent organic group containing 2 to 70 carbon atoms and are each an amine residue.

In the resin (A2), the structural unit represented by the formula (17) preferably accounts for 1 mol % or more and 30 mol % or less, more preferably 1 mol % or more and 15 mol % or less. If the content is 1 mol % or more, it is possible to ensure a lower dielectric constant and a lower dissipation factor. If it is 30 mol % or less, on the other hand, it is possible to ensure a higher heat resistance.

If an ethylenically unsaturated bond is located at any position of $R^{19}$'s and $R^{20}$'s in the formula (18), $R^{21}$'s and $R^{22}$'s in the formula (19), or $R^{24}$'s and $R^{25}$'s in the formula (20) given above, it serves to cause crosslinking of resins in the curing step, leading to a higher heat resistance.

To introduce an ethylenically unsaturated bond into a resin, there are generally known useful methods such as a process in which a hydroxyl group and/or carboxy group in a resin is reacted with a compound having an ethylenically unsaturated double bond group and a process in which a resin is produced by polymerizing monomers having ethylenically unsaturated bonds. From the viewpoint of reactivity, such a compound having an ethylenically unsaturated double bond group is preferably an electrophilic compound having an ethylenically unsaturated double bond group.

Examples of such an electrophilic compound include isocyanate compounds, isothiocyanate compounds, epoxy compounds, aldehyde compounds, thioaldehyde compounds, ketone compounds, thioketone compounds, acetate compounds, carboxylic acid chlorides, carboxylic anhydrides, carboxylic acid active ester compounds, carboxylic acid compounds, alkyl halide compounds, alkyl azide compounds, alkyl triflate compounds, alkyl mesylate compounds, alkyl tosylate compounds, and alkyl cyanide compounds, of which isocyanate compounds, epoxy compounds, aldehyde compounds, ketone compounds, and carboxylic anhydrides are preferable, and isocyanate compounds, epoxy compounds, and carboxylic anhydrides are more preferable, from the viewpoint of reactivity and applicability of the compounds.

A polymerization inhibitor may be added in a small amount in order to prevent the ethylenically unsaturated bonds from crosslinking during the reaction. Good polymerization inhibitors include phenol compounds such as hydroquinone, 4-methoxyphenol, t-butylpyrocatechol, and bis-t-butylhydroxytoluene. The quantity of the polymerization inhibitor to be added is preferably such that the phenolic hydroxyl group in the polymerization inhibitor accounts for 0.1 mol % or more and 5 mol % or less relative to the ethylenically unsaturated bonds in alcohols.

The photosensitive resin composition according to the present invention includes a resin (A3) and a photopolymerization initiator (B), wherein the resin (A3) (hereinafter occasionally referred as the component (A3)) contains one or more structural units selected from those represented by any of the formula (1), formula (3), and formula (5) and further contains one or more structural units selected from those represented by any of the formula (2), formula (4), and formula (6).

[Chemical compound 19]

(1)

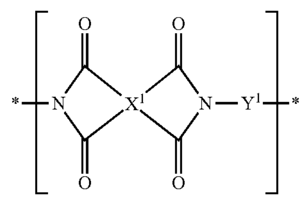

In the formula (1), $X^1$ denotes a tetravalent organic group containing 2 to 60 carbon atoms; $Y^1$ denotes a divalent organic group containing 2 to 70 carbon atoms; at least either $X^1$ or $Y^1$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point.

[Chemical compound 20]

(2)

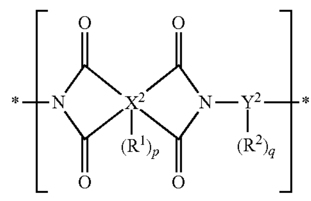

In the formula (2), $X^2$ denotes a tetravalent to hexavalent organic group containing 2 to 60 carbon atoms; $Y^2$ denotes a divalent to hexavalent organic group containing 2 to 70 carbon atoms; $R^1$'s and $R^2$'s each independently denote a carboxyl group, a hydroxyl group, or a monovalent organic group containing 3 to 30 carbon atoms and having an ethylenically unsaturated bond; at least one of $R^1$'s and $R^2$'s is a monovalent organic group containing 3 to 30 carbon atoms and having an ethylenically unsaturated bond; p denotes an integer of 0 to 2; q denotes an integer of 0 to 4; the relation $1 \leq p+q \leq 6$ holds; and * denotes a bonding point.

[Chemical compound 21]

(3)

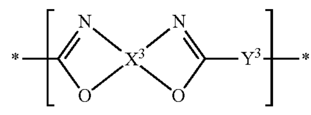

In the formula (3), $X^3$ denotes a tetravalent organic group containing 2 to 60 carbon atoms; $Y^3$ denotes a divalent organic group containing 2 to 70 carbon atoms; at least either $X^3$ or $Y^3$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point.

[Chemical compound 22]

(4)

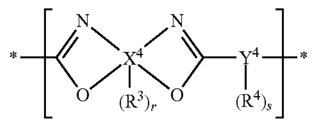

In the formula (4), $X^4$ denotes a tetravalent to hexavalent organic group containing 2 to 60 carbon atoms; $Y^4$ denotes a divalent to hexavalent organic group containing 2 to 70 carbon atoms; $R^3$'s and $R^4$'s may be identical to or different from each other and each independently denote a carboxyl group, a hydroxyl group, or a monovalent organic group containing 3 to 30 carbon atoms and having an ethylenically unsaturated bond; at least one of $R^3$'s and $R^4$'s is a monovalent organic group containing 3 to 30 carbon atoms and having an ethylenically unsaturated bond; r denotes an integer of 0 to 2; s denotes an integer of 0 to 4; the relation $1 \leq r+s \leq 6$ holds, and * denotes a bonding point.

Because of the existence of an ethylenically unsaturated bond, the film residue percentage after the development step can be increased and a higher heat resistance can be developed as a result of crosslinking between resins during the curing step.

[Chemical compound 23]

(5)

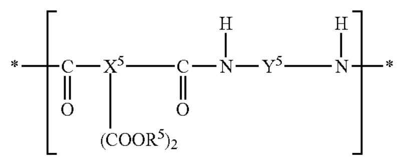

In the formula (5), $X^5$ denotes a tetravalent organic group containing 2 to 60 carbon atoms; $Y^5$ denotes a divalent organic group containing 2 to 70 carbon atoms; at least either $X^5$ or $Y^5$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; ($COOR^5$) is a substituent group located at a position where it can form an imide ring with an amide group bonded to $X^5$; $R^5$ denotes a hydrogen atom or an organic group containing 1 to 5 carbon atoms; and * denotes a bonding point.

[Chemical compound 24]

(6)

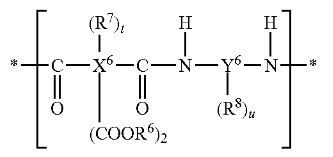

In the formula (6), $X^6$ denotes a tetravalent to hexavalent organic group containing 2 to 60 carbon atoms; $Y^6$ denotes a divalent to hexavalent organic group containing 2 to 70 carbon atoms; ($COOR^6$) is a substituent group located at a position where it can form an imide ring with an amide group bonded to $X^6$; $R^6$ is a hydrogen atom or an organic group containing 1 to 5 carbon atoms; $R^7$ is a hydroxyl group or a monovalent organic group containing 3 to 30 carbon atoms and having an ethylenically unsaturated bond; $R^8$ is a carboxyl group, a hydroxyl group, or a monovalent organic group containing 3 to 30 carbon atoms and having an ethylenically unsaturated bond; at least one of $R^7$'s and $R^8$'s contains 3 to 30 carbon atoms and having an ethylenically unsaturated bond; t denotes an integer of 0 to 2; u denotes an integer of 0 to 4; the relation $1 \leq t+u \leq 6$ holds; and * denotes a bonding point.

The photosensitive resin composition according to the present invention contains the component (A3), and when cured, this allows the photosensitive resin composition according to the present invention to form a cured film according to the present invention, which has a low dielectric constant and a low dissipation factor.

In the formula (1), formula (3), and formula (5), $X^1$, $X^3$, and $X^5$ each denote a tetravalent organic group containing 2 to 60 carbon atoms and are each a residue of an acid component. Examples of such an acid component include tetracarboxylic acid, tetracarboxylic dianhydride, and tetracarboxylic acid diester dichloride.

$Y^1$, $Y^3$, and $Y^5$ each denote a divalent organic group containing 2 to 70 carbon atoms and are each an amine residue.

At least either $X^1$ or $Y^1$ is a multivalent carboxylic acid residue and/or a multivalent amine residue having an alicyclic hydrocarbon structure (hereinafter occasionally referred to simply as the structure (a)) that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond.

At least either $X^3$ or $Y^3$ is a multivalent carboxylic acid residue and/or a multivalent amine residue having an alicyclic hydrocarbon structure (hereinafter occasionally referred to simply as the structure (a)) that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond.

At least either $X^5$ or $Y^5$ is a multivalent carboxylic acid residue and/or a multivalent amine residue having an alicyclic hydrocarbon structure (hereinafter occasionally referred to simply as the structure (a)) that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond.

The inclusion of such a structure allows the resin composition to be cured into a cured film having a high elongation percentage, low dielectric constant, and low dissipation factor.

Good examples of the structure (a) include the cyclobutyl group, cyclobutenyl group, cyclopentyl group, cyclopentenyl group, cyclohexyl group, cyclohexenyl group, cycloheptyl group, cycloheptenyl group, cyclooctyl group, and cyclooctenyl group. Of these, the cyclohexyl group, cyclohexenyl group, cycloheptyl group, and cycloheptenyl group are preferable from the viewpoint of heat stability.

Examples of a hydrocarbon group that contains 4 to 12 carbon atoms and that may have an unsaturated bond include the n-butyl group, i-butyl group, t-butyl group, 1-butenyl group, 2-butenyl group, n-pentyl group, i-pentyl group, 1-pentenyl group, 2-pentenyl group, n-hexyl group, i-hexyl group, 1-hexenyl group, 2-hexenyl group, n-heptyl group, i-heptyl group, 1-heptenyl group, 2-heptenyl group, n-octyl group, i-octyl group, 1-octenyl group, 2-octenyl group, nonyl group, 1-nonenyl group, decanyl group, 1-decenyl group, undecanyl group, 1-undecenyl group, dodecanyl group, and 1-dodecenyl group.

Examples of a carboxylic acid compound that gives a multivalent carboxylic acid residue include tetracarboxylic acid, hexacarboxylic acid, and octacarboxylic acid, and examples of an amine compound that gives a multivalent amine residue include diamine, triamine, and tetraamine.

A$Y^1$, $Y^3$, or $Y^5$ having a structure (a) as described above originates in a residue of a diamine, triamine or a derivative thereof having the structure (a). Furthermore, if an amino compound corresponding to such a multivalent amine residue is added in the polymerization step, it serves to produce a structural unit that contains the multivalent amine residue. The multivalent amine residue having a structure (a) is preferably a multivalent amine residue as represented by the formula (7) and more preferably a diamine residue containing no double bond as represented by the formula (8) from the viewpoint of reliability of the intended cured film. The adoption of a diamine residue as represented by the formula (9) is particularly preferable from the viewpoint of the cost of the diamine, the elongation percentage of the intended cured film, and the like.

[Chemical compound 25]

(7)

(7a)

(7b)

(7c)

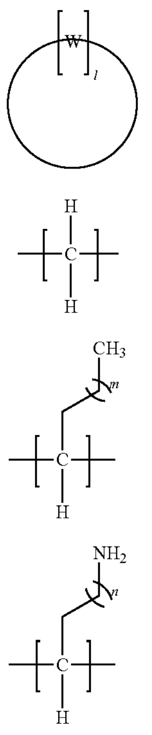

In the formula (7), I denotes an integer of 4 to 8; W's each independently denote a structural unit as represented by the formula (7a), (7b), or (7c); two or more of the I W's are structural units of (7c); the sum of the number of structural units of (7b) and that of (7c) is 4 or more and 8 or less, and m and n are each independently an integer of 3 to 11.

[Chemical compound 26]

(8)

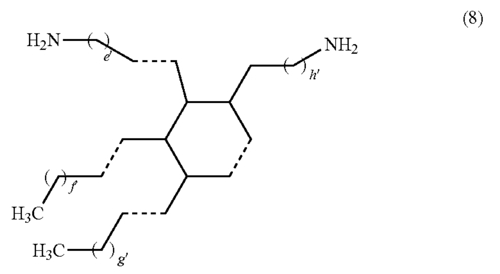

In the formula (8), e', f', g', and h' are each a natural number and satisfy the relations e'+f=6 to 17 and g'+h'=8 to 19. Each broken line represents either a carbon-carbon single bond or a carbon-carbon double bond. It should be noted that at least one double bond is contained in a molecule.

Specific example of a multivalent amine having a structure (a) include commercial dimer diamine and trimer triamine products such as Versamine (registered trademark) 551, Versamine (registered trademark) 552 (both trade names, manufactured by BASF), Priamine (registered trademark) 1071, Priamine (registered trademark) 1073, Priamine (registered trademark)1074, and Priamine (registered trademark) 1075 (all trade names, manufactured by Croda Japan K.K.). Of these, Versamine (registered trademark) 551 and Priamine (registered trademark) 1074 are dimer diamine compounds containing compounds as represented by the formula (10), whereas Versamine (registered trademark) 552, Priamine (registered trademark) 1073, and Priamine (registered trademark) 1075 are dimer diamine compounds containing compounds as represented by the formula (9). Priamine (registered trademark) 1071 is a mixture of a dimer diamine and a trimer triamine.

An $X^1$, $X^3$, or $X^5$ that has a structure (a) as described above originates in a residue of a multivalent carboxylic acid containing the structure (a) or a residue of a derivative thereof. Furthermore, if an acid component corresponding to such a multivalent carboxylic acid residue is added in the polymerization step, it serves to produce a structural unit that contains the acid residue. Examples of a multivalent carboxylic acid residue having a structure (a) include residues of reaction products of a trimellitic anhydride chloride and a multivalent amine having a structure (a) as cited above in relation to $Y^1$, $Y^3$, or $Y^5$. More specifically, they include residues as represented by the formula (11).

If an ethylenically unsaturated bond is located at any position of $R^1$'s and $R^2$'s in the formula (2), $R^3$'s and $R^4$'s in the formula (4), or $R^7$'s and $R^8$'s in the formula (6) given above, it serves to cause crosslinking between resins in the curing step, leading to a higher heat resistance.

To introduce an ethylenically unsaturated bond into a resin, there are generally known useful methods such as a process in which a hydroxyl group and/or carboxy group in a resin is reacted with a compound having an ethylenically unsaturated double bond group and a process in which a resin is produced by polymerizing monomers having ethylenically unsaturated bonds. From the viewpoint of reactivity, such a compound having an ethylenically unsaturated double bond group is preferably an electrophilic compound having an ethylenically unsaturated double bond group.

Examples of such an electrophilic compound include isocyanate compounds, isothiocyanate compounds, epoxy compounds, aldehyde compounds, thioaldehyde compounds, ketone compounds, thioketone compounds, acetate compounds, carboxylic acid chlorides, carboxylic anhydrides, carboxylic acid active ester compounds, carboxylic acid compounds, alkyl halide compounds, alkyl azide compounds, alkyl triflate compounds, alkyl mesylate compounds, alkyl tosylate compounds, and alkyl cyanide compounds, of which isocyanate compounds, epoxy compounds, aldehyde compounds, ketone compounds, and carboxylic anhydrides are preferable, and isocyanate compounds, epoxy compounds, and carboxylic anhydrides are more preferable, from the viewpoint of reactivity and applicability of the compounds.

A polymerization inhibitor may be added in a small amount in order to prevent the ethylenically unsaturated bonds from crosslinking during the reaction. Good polymerization inhibitors include phenol compounds such as hydroquinone, 4-methoxyphenol, t-butylpyrocatechol, and bis-t-butylhydroxytoluene. The quantity of the polymerization inhibitor to be added is preferably such that the phenolic hydroxyl group in the polymerization inhibitor accounts for 0.1 mol % or more and 5 mol % or less relative to the ethylenically unsaturated bonds in alcohols.

From the viewpoint of ensuring an improved exposure sensitivity,

- when the resin (A3) contains a structural unit as represented by the formula (2) given above, at least one of $R^1$'s and $R^2$'s is preferably a group as represented by the formula (12) or the formula (13),
- when the resin (A3) contains a structural unit as represented by the formula (4) given above, at least one of $R^3$'s and $R^4$'s is preferably a group as represented by the formula (12) or the formula (13), and
- when the resin (A3) contains a structural unit as represented by the formula (6) given above, at least one of $R^7$'s and $R^8$'s is preferably a group as represented by the formula (12) or the formula (13).

[Chemical compound 27]

(12)

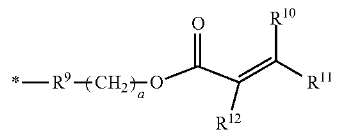

In the formula (12), $R^9$ is a linking group of $-OCH_2CH(OH)-$, $-OCONH-$, $-NHCH_2CH(OH)-$, or $-NHCONH-$; $R^{10}$, $R^{11}$, and $R^{12}$ are each a hydrogen atom, a methyl group, an ethyl group, or a propyl group; a is an integer of 1 to 10; and * denotes a bonding point.

$R^9$ is preferably $-OCONH-$ or $-NHCONH-$ because these groups can be introduced easily into the resin (A3).

[Chemical compound 28]

(13)

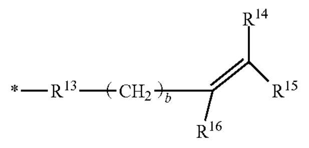

In the formula (13), $R^{13}$ is a linking group of $-OCO-$ or $-NHCO-$; $R^{14}$, $R^{15}$, and $R^{16}$ are each a hydrogen atom, a methyl group, an ethyl group, or a propyl group; b is an integer of 0 to 10; and * denotes a bonding point.

$R^{13}$ is preferably $-NHCO-$ from the viewpoint of heat resistance of the intended cured film.

It is preferable for at least one selected from the group consisting of the structural units represented by the formula (1), formula (3), or formula (5) to account for 1 to 30 mol %, more preferably 1 to 15 mol %, relative to all structural units, which accounts for 100 mol %, in the resin (A3). If the content is in the above range, it serves to ensure a higher heat resistance while maintaining a low dielectric constant and a low dissipation factor.

In the formulae (1) to (6), it is preferable that $X^1$ to $X^8$ contain at least one selected from the group consisting of a bisphenol A backbone, biphenyl backbone, hexafluoroisopropylidene backbone, and a residue of an acid anhydride as represented by the formula (14), or that $Y^1$ to $Y^6$ contain at least one selected from the group consisting of a bisphenol A backbone, biphenyl backbone, hexafluoroisopropylidene backbone, and a residue of a diamine as represented by the formula (15).

If they have these structural units, it serves to develop heat resistance and solubility in organic solvents while maintaining a low dielectric constant and a low dissipation factor.

[Chemical compound 29]

(14)

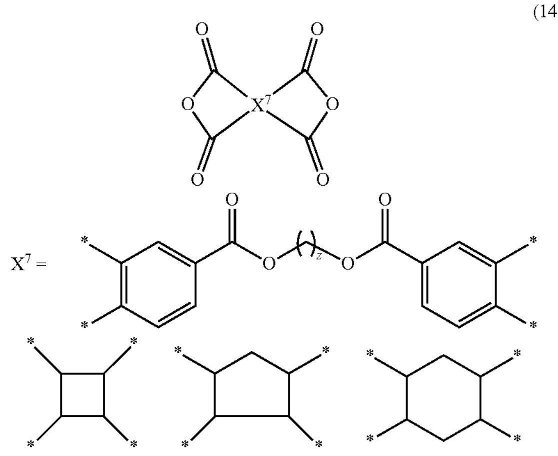

In the formula (14), z denotes an integer of 6 to 20, and * denotes a bonding point

[Chemical compound 30]

(15)

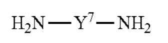

-continued

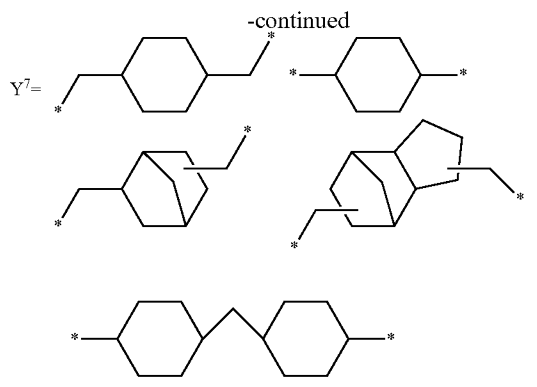

In the formula (15), * denotes a bonding point.

Examples of a carboxylic acid compound containing an acid residue in the form of a bisphenol A backbone, biphenyl backbone, or hexafluoroisopropylidene backbone include 3,3',4,4'-biphenyltetracarboxylic acid, 2,3,3',4'-biphenyltetracarboxylic acid, 2,2',3,3'-biphenyltetracarboxylic acid, 2,2-bis(3,4-dicarboxyphenyl) hexafluoropropane, 2,2-bis(2,3-dicarboxyphenyl) hexafluoropropane, 4,4'-(4,4'-isopropylidenediphenoxy)bis(phthalic acid), 4,4'-(4,4'-isopropylidenediphenoxycarbonyl) bis(phthalic acid), and derivatives thereof. Of these, 2,2-bis(3,4-dicarboxyphenyl) hexafluoropropane, 2,2-bis(2,3-dicarboxyphenyl) hexafluoropropane, and 4,4'-(4,4'-isopropylidenediphenoxy) bis(phthalic acid) are preferable from the viewpoint of solubility in organic solvents, transparency, and low dielectric constant.

Examples of an amino compound containing a diamine residue in the form of a bisphenol A backbone, biphenyl backbone, or hexafluoroisopropylidene backbone include 4,4'-diaminobiphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-bis(trifluoromethyl)-4,4'-diaminobiphenyl, bis(3-amino-4-hydroxy)biphenyl, 4,4'-diamino-6,6'-bis(trifluoromethyl)-[1,1'-biphenyl]-3,3'-diol, bis(4-aminophenoxy)biphenyl, 2,2-bis[4-(4-aminophenoxy) phenyl]hexafluoropropane, bis(3-amino-4-hydroxyphenyl) hexafluoropropane, 2,2'-bis[N-(3-aminobenzoyl)-3-amino-4-hydroxyphenyl] hexafluoropropane, 2,2'-bis[N-(4-aminobenzoyl)-3-amino-4-hydroxyphenyl] hexafluoropropane, 2,2-bis[4-(4-aminophenoxy)phenyl] propane, and derivatives thereof.

Of these, aromatic diamines such as 2,2'-bis(trifluoromethyl)-4,4'-diaminobiphenyl, bis(3-amino-4-hydroxyphenyl) hexafluoropropane, and 2,2-bis[4-(4-aminophenoxy) phenyl]propane, as well as 1,4-cyclohexanediamine, 1,2-bis (aminomethyl)cyclohexane, and 1,3-bis(aminomethyl) cyclohexane, which are represented by the general formula (15), are preferable from the viewpoint of solubility in organic solvents, transparency, and low dielectric constant.

It is more preferable for $Y^1$ to $Y^6$ in the formulae (1) to (6) to contain a residue of a diamine as represented by the formula (16).

The inclusion of such a diamine residue serves to ensure a lower dissipation factor and develop heat resistance.

[Chemical compound 31]

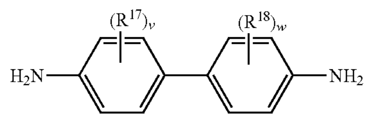

(16)

In the formula (16), $R^{17}$'s and $R^{18}$'s each independently denote a group selected from the methyl group, trifluoromethyl group, and hydroxyl group, and v and w each denote an integer of 0 to 4.

Examples of amino compounds containing such diamine residues include, for example, 2,2'-bis(trifluoromethyl)-4,4'-diaminobiphenyl, 2,2'-dimethylbiphenyl-4,4'-diamine, and 3,3'-dihydroxybenzidine.

Examples of carboxylic acid compounds that can give other acid residues useful for $X^1$ to $X^6$ and $X^8$ to $X^{10}$ include aromatic tetracarboxylic acids such as pyromellitic acid, 3,3',4,4'-benzophenonetetracarboxylic acid, 2,2',3,3'-benzophenonetetracarboxylic acid, 1,1-bis(3,4-dicarboxyphenyl) ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl) thioether, bis(3,4-dicarboxyphenyl)ether, 1,3-bis(3,4-dicarboxyphenoxy)benzene, (3,4-dicarboxyphenyl)trimellitate, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, and aliphatic tetracarboxylic acids such as bicyclo[3.1.1.]hept-2-enetetracarboxylic acid, bicyclo[2.2.2.]octanetetracarboxylic acid, and adamantanetetracarboxylic acid.

These acids may be used in their original forms or in the form of an anhydride, acid chloride, or active ester. Examples of active ester groups include, but not limited to, the following compounds.

[Chemical compound 32]

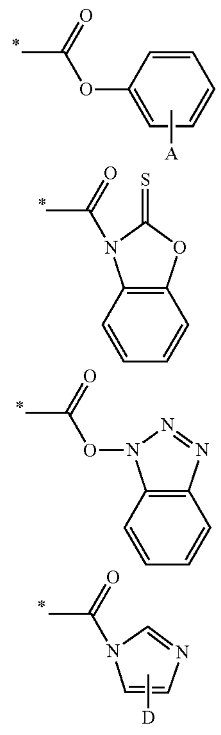

-continued

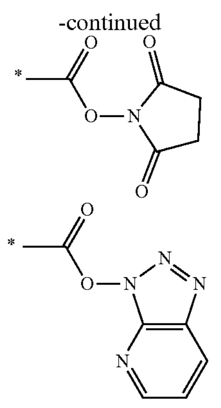

In the formula, A and D each denote a hydrogen atom, methyl group, ethyl group, propyl group, isopropyl group, t-butyl group, trifluoromethyl group, halogen group, phenoxy group, or nitro group. In addition, * denotes a bonding point.

The use of a tetracarboxylic acid containing a silicon atom such as dimethylsilanediphthalic acid and 1,3-bis(phthalic acid)tetramethyl disiloxane can serve to increase the adhesiveness to the substrate and the resistance to oxygen plasma used for cleaning and the like and to UV ozone treatment. It is preferable that such a tetracarboxylic acid containing a silicon atom account for 1 to 30 mol % of all acid components.

Examples of amine compounds that can give other amine residues useful for $Y^1$ to $Y^6$ and $Y^8$ to $Y^{10}$ include, but not limited to, aromatic diamines such as m-phenylenediamine, p-phenylenediamine, 3,4'-diaminodiphenylether, 4,4'-diaminodiphenylether, bis[4-(4-aminophenoxy)phenyl]ether, 1,4-bis(4-aminophenoxy)benzene bis(3-amino-4-hydroxyphenyl)ether, 3,4'-diaminodiphenylmethane, bis(3-amino-4-hydroxyphenyl)methylene, 4,4'-diaminodiphenylmethane, bis(3-amino-4-hydroxyphenyl)sulfone, bis(4-aminophenoxyphenyl)sulfone, bis(3-amino-4-hydroxyphenyl)propane, 9,9-bis(3-amino-4-hydroxyphenyl)fluorene, 2,7-diaminofluorene, 9,9-bis(4-aminophenyl)fluorene, N, N'-bis(4-aminobenzoyl)-4,4'-diamino-3,3-dihydroxybiphenyl, N, N'-bis(3-aminobenzoyl)-3,3'-diamino-4,4-dihydroxybiphenyl, N, N'-bis(4-aminobenzoyl)-3,3'-diamino-4,4-dihydroxybiphenyl, 3,4'-diaminodiphenylsulfide, 4,4'-diaminodiphenylsulfide, and other aromatic diamines, as well as compounds derived therefrom by substituting part of the hydrogen atoms in the aromatic rings with alkyl groups containing 1 to 10 carbon atoms, fluoroalkyl groups, halogen atoms, or the like.

Examples of useful aliphatic diamines include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane, and in particular, diamines containing siloxane structures include bis(3-aminopropyl)tetramethyldisiloxane and bis(p-aminophenyl)octamethylpentasiloxane, which are preferable because they can develop stronger adhesiveness with substrates.

These diamine compounds may be used in their original forms, but the amine site may be isocyanated or trimethylsilylated before use. Furthermore, two or more of these diamine compounds may be used in combination.

It is also preferable for the structure of the resin (A1), resin (A2), or resin (A3) to contain a fluorine component. Containing a fluorine component means containing an organic group that has a fluorine atom in its structure, and it is preferable that any of $X^1$ to $X^6$ and $X^8$ to $X^{10}$ or any of $Y^1$ to $Y^6$ and $Y^8$ to $Y^{10}$ contain an organic group that has a fluorine atom. To introduce a fluorine component, there are generally known good methods such as a process in which a resin is produced by polymerizing monomers having fluorine atoms and a process in which hydroxyl groups and/or carboxyl groups in a resin are reacted with compounds having fluorine atoms.

Specific examples of compounds containing fluorine atoms include 2,2-bis(3,4-dicarboxyphenyl) hexafluoropropane dianhydride, compounds derived therefrom by substituting the aromatic ring with an alkyl group or a halogen atom, aromatic acid dianhydrides such as dianhydrides having amide groups, aromatic diamines such as bis(3-amino-4-hydroxyphenyl) hexafluoropropane and 2,2'-bis(trifluoromethyl)-4,4'-diaminobiphenyl, and compounds derived therefrom by substituting part of the hydrogen atoms in the aromatic rings with alkyl groups containing 1 to 10 carbon atoms, fluoroalkyl groups, halogen atoms, or the like.

Since fluorine has a large atomic radius, it acts to increase the free volume and leads to a lower dielectric constant and a lower dissipation factor. Such organic groups having fluorine atoms preferably account for 30 mol % or more of all structural units, which account for 100 mol %, in the resin (A1), resin (A2), or resin (A3). On the other hand, in order to ensure good contact with substrate, organic groups having fluorine atoms preferably account for 90 mol % or less.

Furthermore, it is preferable for phenolic hydroxyl groups to account for 1 to 25 mol % of all structural units, which account for 100 mol %, in the resin (A1), resin (A2), or resin (A3). It is preferable that any of $X^1$ to $X^6$ and $X^B$ to $X^{10}$ or any of $Y^1$ to $Y^6$ and $Y^8$ to $Y^{10}$ contain an organic group that has a phenolic hydroxyl group. Phenolic hydroxyl groups can ensure improved heat resistance due to interaction with hydrogen bonds as well as good mechanical properties and chemical resistance due to contribution of reactions with crosslinking agents. The inclusion of a phenolic hydroxyl group, which is a polar group, tends to deteriorate the dissipation factor, but when its content is as low as 1 to 25 mol % relative to all structural units, which accounts for 100 mol %, in the resin (A1), resin (A2), or resin (A3), it works to improve mechanical properties and chemical resistance while avoiding deterioration in the dissipation factor. It is more preferably 1 to 15 mol %.

Specific examples of the compound containing a phenolic hydroxyl group include 2,2-bis(3,4-dicarboxyphenyl) hexafluoropropane dianhydride, compounds derived therefrom by substituting the aromatic ring with an alkyl group or a halogen atom, aromatic acid dianhydrides such as dianhydrides having amide groups, diamines containing hydroxyl groups such as bis(3-amino-4-hydroxyphenyl) hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl) ether, bis(3-amino-4-hydroxy)biphenyl, and bis(3-amino-4-hydroxyphenyl)fluorene, and compounds derived therefrom by substituting part of the hydrogen atoms in the aromatic rings with alkyl groups containing 1 to 10 carbon atoms, fluoroalkyl groups, halogen atoms, or the like.

In the (A1) to (A3) components, the backbone chain end may be capped with an end-capping agent so that the resulting photosensitive resin composition according to the present invention will have improved storage stability or develop a special function. Good end capping agents include monoamines, acid anhydrides, monocarboxylic acids, monoacid chloride compounds, and monoactive ester compounds. Furthermore, if the chain end of a resin is capped with an end-capping agent containing a hydroxyl group, carboxyl group, sulfonic acid group, thiol group, vinyl group, ethynyl group, maleimide group, or allyl group, it may serve to easily achieve an exposure sensitivity in a favorable range or easily produce a cured film having mechanical properties in a favorable range.

The content of the end-capping agent added is preferably 0.1 mol % or more and 60 mol % or less, and particularly preferably 5 mol % or more and 50 mol % or less, from the viewpoint of the solubility in developers and the mechanical properties of the intended cured film. A plurality of different end capping agents may be reacted to introduce a plurality of different end groups.

There are generally known monoamines that can be used as end capping agents, and preferable ones include aniline, 2-ethynyl aniline, 3-ethynylaniline, 4-ethynylaniline, 1-hydroxy-7-aminonaphthalene, 1-carboxy-7-aminonaphthalene, 3-aminobenzoic acid, 3-aminophenol, and 3-aminothiophenol. Two or more of these may be used in combination.

For the aforementioned acid anhydride, monocarboxylic acid, monoacid chloride compound, and monoactive ester compound, generally known compounds may be used, and preferable acid anhydrides include phthalic anhydride, maleic anhydride, nadic anhydride, cyclohexanedicarboxylic anhydride, 3-hydroxyphthalic anhydride, and itaconic anhydride. The use of a maleic anhydride or an itaconic anhydride is particularly preferable. Two or more of these may be used in combination.

It is preferable for the components (A1) to (A3) used for the present invention to have a weight average molecular weight of 5,000 or more and 100,000 or less. The weight average molecular weight is measured by GPC (gel permeation chromatography). If it is 5,000 or more in terms of polystyrene, it serves to ensure better mechanical properties such as elongation percentage, rupture strength, and modulus after curing. On the other hand, if the weight average molecular weight is 100,000 or less, it ensures a further increase in developability. It is more preferably 10,000 or more to achieve better mechanical properties. In the case where two or more resins are contained in the components (A1) to (A3), it is only necessary that at least one of them have a weight average molecular weight in the above range.

The photosensitive resin composition according to the present invention includes a photopolymerization initiator (B). The inclusion of the photopolymerization initiator (B) makes it possible to produce a pattern through exposure and development steps. There are no specific limitations on the photopolymerization initiator (B) as long as it generates radicals when exposed to light, but preferable ones include alkylphenon compounds, aminobenzophenone compounds, diketone compounds, keto ester compounds, phosphine oxide compounds, oxime ester compounds, and benzoic acid ester compounds because they are high in sensitivity, stability, and synthesizability. In particular, from the viewpoint of sensitivity, more preferable ones include alkylphenon compounds and oxime ester compounds, of which oxime ester compounds are particularly preferable. When producing a thick film having a film thickness of 5 μm or more after processing, it is particularly preferable to use a phosphine oxide compound from the viewpoint of resolution.

Examples of the alkylphenon compounds include α-aminoalkylphenon compounds such as 2-methyl-[4-(methylthio)phenyl]-2-morpholinopropane-1-one and 2-dimethylamino-2-(4-methylbenzyl)-1-(4-morpholine-4-yl-phenyl)-butane-1-one; α-hydroxyalkylphenon compounds such as 1-hydroxycyclohexyl-phenyl ketone and benzoin; and α-alkoxyalkylphenon compounds such as 4-benzoyl-4-methylphenyl ketone and 2,3-diethoxyacetophenone. Of these, α-aminoalkylphenon compounds are preferable because they have high sensitivity.

Examples of the phosphine oxide compounds include 6-trimethylbenzoylphenylphosphine oxide.

Examples of the oxime ester compounds include 1-[9-ethyl-6-(2-methylbenzoyl)-9H-carbazole-3-yl]-,1-(0-acetyloxime), 2-octanedione, 1-[4-(phenylthio)-2-(O-benzoyloxime)], NCI-831, NCI-930 (both trade names, manufactured by Adeka Corporation), Irgacure (registered trademark) OXE-03, and OXE-04 (both trade names, manufactured by BASF).

Examples of the aminobenzophenone compounds include 4,4-bis(dimethylamino)benzophenone. Examples of the diketone compounds include benzyl. Examples of the keto ester compounds include methyl benzoylformate. Examples of the benzoic acid ester compounds include o-benzoylbenzoic acid methyl ester and p-dimethylaminobenzoic acid ethyl ester.

Other specific examples of the photopolymerization initiator (B) include benzophenone, 4-benzoyl-4'-methyldiphenyl ketone, dibenzylketone, fluorenone, thioxanthone, 2-methylthioxanthone, 2-isopropylthioxanthone, 2-hydroxy-3-(3,4-dimethyl-9-oxo-9H-thioxanthene-2-yloxy)-N,N,N-trimethyl-1-propanaminium chloride, anthraquinone, triphenylphosphine, and carbon tetrabromide.

The photopolymerization initiator (B) preferably accounts for 0.5 parts by mass or more and 20 parts by mass or less relative to the total quantity, which accounts for 100 parts by mass, of the components (A1) to (A3) and the compound having two or more ethylenically unsaturated bonds that is added as required, because it serves to ensure a sufficient sensitivity while preventing significant degassing in the heat-curing step. In particular, the content is more preferably 1.0 parts by mass or more and 10 parts by mass or less.

The photosensitive resin composition according to the present invention may include a sensitizer for the purpose of allowing the photopolymerization initiator (B) to work more strongly. The inclusion of a sensitizer makes it possible to increase the sensitivity and control the photosensitive wavelength appropriately. Examples of the sensitizer include, but not limited to, bis(dimethylamino)benzophenone, bis(diethylamino)benzophenone, diethylthioxanthone, N-phenyldiethanolamine, N-phenylglycine, 7-diethylamino-3-benzoylcoumarin, 7-diethylamino-4-methylcoumarin, N-phenylmorpholine, and derivatives thereof.

It is preferable for the photosensitive resin composition according to the present invention to further include a compound (C) that contains two or more ethylenically unsaturated bonds and an alicyclic structure (hereinafter occasionally referred to simply as the component (C)). The inclusion of the component (C) serves to increase the crosslink density in the light exposure step to further improve the exposure sensitivity, thus contributing to a decrease in required exposure energy and a decrease in film loss during development. The component (C) may include a (meth)acrylate compound containing a generally known alicyclic structure, which serves to achieve a low dielectric constant, low dissipation factor, and high exposure sensitivity all at high level.

Examples of such a polyfunctional (meth)acrylate containing an alicyclic structure include dimethylol-tricyclodecane di(meth)acrylate, 1,3-adamantanediol di(meth)acrylate, 1,3,5-adamantanetriol di(meth)acrylate, 1,3,5-adamantanetriol tri(meth)acrylate, 1,4-cyclohexanedimethanol di(meth)acrylate, 5-hydroxy-1,3-adamantane di(meth)acrylate, and EO-modified hydrogenated bisphenol A di(meth)acrylate.

It is preferable for the component (C) to account for 5 part by mass or more and 100 parts by mass or less, more preferably 10 parts by mass or more and 40 parts by mass or less, relative to 100 parts by mass of the components (A1) to (A3). If the content is in this range, it will be easier to achieve a higher exposure sensitivity, lower dielectric constant, and lower dissipation factor.

The photosensitive resin composition according to the present invention may contain a generally known (meth) acrylate compound in addition to the component (C).

Examples of the polyfunctional (meth)acrylate include diethyleneglycol di(meth)acrylate, trimethylolpropane tri (meth)acrylate, 1,3-butanediol di(meth)acrylate, neopentyl glycol di(meth)acrylate, 1,4-butanediol di(meth)acrylate, 1,6-hexanediol di(meth)acrylate, pentaerythritol tetra(meth) acrylate, ethoxylated bisphenol A di(meth)acrylate, 9,9-bis [4-(2-(meth)acryloyloxyethoxy)phenyl]fluorene.

Other polyfunctional (meth)acrylate compounds include, for example, epoxy (meth)acrylates that can be produced through a reaction of a polyfunctional epoxy compound and (meth)acrylic acid. Epoxy (meth)acrylates can be used for the purpose of improving the alkali developing property because they can serve to develop hydrophilicity. The use of these polyfunctional epoxy compounds is preferable because they are high in heat resistance and chemical resistance.

[Chemical compound 33]

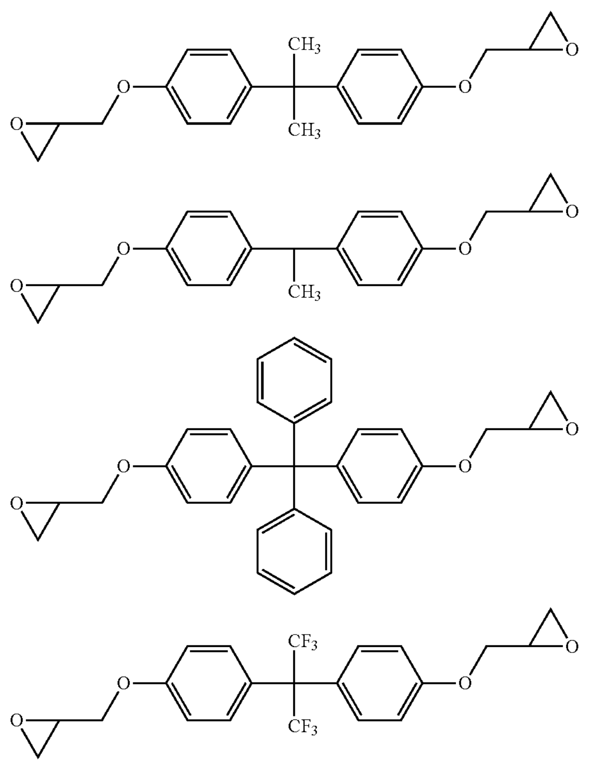

-continued

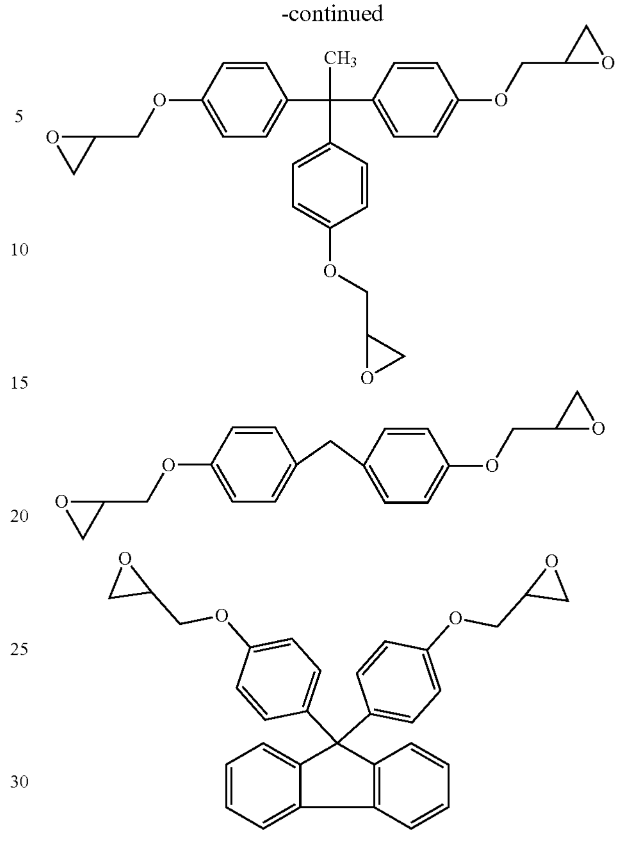

It is preferable for the photosensitive resin composition according to the present invention to include a heat-crosslinker (D) (hereinafter occasionally referred to simply as the component (D)). The inclusion of the component (D) serves to produce a cured film with enhanced heat resistance and chemical resistance.

Examples of such a heat-crosslinker include a compound having an epoxy structure, a compound having a hydroxymethyl structure, and a compound having an alkoxymethyl structure.

A generally known substance may be used as the compound having an epoxy structure. Examples include, but not limited to, Epicron (registered trademark) 850-S, Epicron (registered trademark) HP-4032, Epicron (registered trademark) HP-7200 (all trade names, available from DIC Corporation), RIKARESIN (registered trademark) BPO-20E, RIKARESIN (registered trademark) BEO-60E (both trade names, available from New Japan Chemical Co., Ltd.), EP-4003S, and EP-4000S (both trade names, available from Adeka Corporation).

Generally known substances may be used as the compound having a hydroxymethyl structure and the compound having an alkoxymethyl structure. Examples include DML-PC, TMOM-BPAP, HML-TPPHBA, HML-TPHAP, HMOM-TPPHBA, HMOM-TPHAP (all trade names, available from Honshu Chemical Industry Co., Ltd.), NIKALAC (registered trademark) MX-290, NIKALAC (registered trademark) MX-280, NIKALAC (registered trademark) MX-270, NIKALAC (registered trademark) MX-279, NIKALAC (registered trademark) MW-100LM, and NIKALAC (registered trademark) MX-750LM (all trade names, available from Sanwa Chemical Co., Ltd.).

Among others, it is preferable to select an appropriate one from TMOM-BPAP, NIKALAC MX-290, NIKALAC MX-280, NIKALAC MX-270, NIKALAC MX-279, NIKALAC MW-100LM, and NIKALAC MX-750LM from the viewpoint of heat resistance and chemical resistance of the intended cured film and from the viewpoint of storage stability.

It is preferable for the heat-crosslinker to account for 1 part by mass or more and 20.0 parts by mass or less, more preferably 5 parts by mass or more and 15 parts by mass or less, relative to 100 parts by mass of the components (A1) to (A3). If the content is in this range, it serves to ensure the production of a cured film having improved chemical resistance and heat resistance while maintaining a low dissipation factor.

The photosensitive resin composition according to the present invention may contain an antioxidant. The inclusion of an antioxidant serves to suppress yellowing of the cured film during heat treatment performed in a subsequent step and prevent deterioration in mechanical properties such as elongation percentage. Furthermore, this is preferable also because it works to prevent rust on metal material, thus serving to protect metal material against oxidization.

Preferable antioxidants include hindered phenolic antioxidants and hindered amine based antioxidants.

Examples of hindered phenolic antioxidants include, but not limited to, Irganox (registered trademark) 245, 3114, 1010, 1098, 1135, 259, and 035 (all trade names, manufactured by BASF), and 2,6-di(t-butyl)-p-cresol.

Examples hindered amine based antioxidants include TINUVIN (registered trademark) 144, 292, 765, and 123 (all trade names, manufactured by BASF).

Other antioxidants include phenol, catechol, resorcinol, hydroquinone, 4-t-butylcatechol, 2,6-di(t-butyl)-p-cresol, phenothiazine, and 4-methoxyphenol. When adding an antioxidant, it preferably accounts for 0.1 part by mass or more and 10.0 parts by mass or less, more preferably 0.3 parts by mass or more and 5.0 parts by mass or less, relative to 100 parts by mass of the components (A1) to (A3). If the content is in this range, it serves to ensure good developing property and appropriately suppress color change due to heat treatment.

The photosensitive resin composition according to the present invention may include a heterocyclic compound containing a nitrogen atom. The inclusion of a heterocyclic compound containing a nitrogen atom can ensure good adhesion to an easily oxidizable metallic substrate made of copper, aluminum, silver, or the like. Although the mechanism has not been clarified, it is inferred that the nitrogen atom, which has the property of coordinating with metal, interacts with the metal surface and the interaction is stabilized by the bulky heterocycle.

Examples of the heterocyclic compound containing a nitrogen atom include imidazole, pyrazole, indazole, carbazole, pyrazoline, pyrazolidine, triazole, tetrazole, pyridine, piperidine, pyrimidine, pyrazine, triazine, cyanuric acid, isocyanuric acid, and derivatives thereof.

From the viewpoint of reactivity with metal, preferable examples of the heterocyclic compound containing a nitrogen atom include 1H-benzotriazole, 4-methyl-1H-methyl benzotriazole, 5-methyl-1H-methylbenzotriazole, 4-carboxy-1H-benzotriazole, 5-carboxy-1H-benzotriazole, 1H-tetrazole, 5-methyl-1H-tetrazole, and 5-phenyl-1H-tetrazole.

It is preferable for the heterocyclic compound containing a nitrogen atom account for 0.01 part by mass or more and 5.0 parts by mass or less, more preferably 0.05 parts by mass or more and 3.0 parts by mass or less, relative to 100 parts by mass of the components (A1) to (A3). If the content is in this range, it serves to ensure good developing property and appropriate stabilization of the substrate metal.

The photosensitive resin composition according to the present invention may include a solvent. Such solvents include, for example, polar aprotic solvents such as N-methyl-2-pyrrolidone, γ-butyrolactone, γ-valerolactone, δ-valerolactone, N,N-dimethylformamide, N,N-dimethylacetamide, dimethylsulfoxide, N,N'-dimethylpropylene urea, N,N-dimethylisobutyric acid amide, and methoxy-N,N-dimethylpropionamide; ethers such as tetrahydrofuran, propylene glycol monomethyl ether, and propylene glycol monoethyl ether; ketones such as methylethylketone, diisobutylketone, and cyclohexanone; esters such as butylacetate and propylene glycol monomethyl ether acetate; alcohols such as ethyl lactate, methyl lactate, diacetone alcohol, and 3-methyl-3-methoxybutanol; and aromatic hydrocarbons such as toluene and xylene. Two or more of these may be contained together.

To ensure dissolution of the composition, the solvent used preferably accounts for 100 parts by mass or more relative to 100 parts by mass of the components (A1) to (A3). To ensure the formation of a coat film with a film thickness of 1 μm or more, it preferably accounts for 1,500 parts by mass or less.

In order to enhance adhesion to the substrate, the photosensitive resin composition according to the present invention may contain, as a silicone component, a silane coupling agent unless it impairs storage stability. Examples of such a silane coupling agent include trimethoxyaminopropyl silane, trimethoxycyclohexylepoxyethyl silane, trimethoxyvinyl silane, trimethoxythiolpropyl silane, trimethoxyglycidyloxypropyl silane, tris-(trimethoxysilylpropyl) isocyanurate, triethoxyaminopropyl silane, and reaction products of trimethoxyaminopropyl silane and acid anhydrides. Such a reaction product may be used in the form of an amide acid or in an imidized form. Examples of the acid anhydrides used for the reaction include succinic anhydride, maleic anhydride, nadic anhydride, cyclohexanedicarboxylic anhydride, 3-hydroxyphthalic anhydride, pyromellitic dianhydride, 3,3',4,4'-biphenyltetracarboxylic dianhydride, 2,2',3,3'-benzophenonetetracarboxylic dianhydride, and 4,4'-oxydiphthalic dianhydride. The silane coupling agent preferably accounts for 0.01 to 10 parts by mass relative to 100 parts by mass of the components (A1) to (A3).

Described next is a photosensitive sheet formed on a base material using the photosensitive resin composition according to the present invention.

The photosensitive sheet according to the present invention is produced by spreading the photosensitive resin composition according to the present invention over a base material and drying it in temperature and time ranges where the solvent can be volatilized, thereby providing an incompletely cured sheet that is soluble in an organic solvent or aqueous alkali solution.

There are no specific limitations on the base material, and various useful films are commercially available, including polyethylene terephthalate (PET) film, polyphenylene sulfide film, and polyimide film. The surface of the base material to be brought into contact with the photosensitive resin composition may be surface-treated with silicone, silane coupling agent, aluminum chelating agent, polyurea, or the like in order to ensure strong contact and easy peeling. The thickness of the base material is not particularly limited, but it is preferably in the range of 10 to 100 μm from the viewpoint of workability. In addition, the film surface may have a protection film to protect the film surface coated with the photosensitive composition. This serves to protect the surface of the photosensitive resin composition from contaminants such as dirt and dust in the air.

Good methods to spread the photosensitive resin composition over a base material include spin coating using a spinner, spray coating, roll coating, screen printing, and coating techniques using a blade coater, die coater, calender coater, meniscus coater, bar coater, roll coater, comma roll coater, gravure coater, screen coater, slit die coater, or the like. Although the required thickness of a coating film varies depending on the coating technique used, the solid content and viscosity of the composition, and the like, it is commonly preferable for the dried film to have a thickness of 0.5 μm or more and 100 μm or less from the viewpoint of the uniformity of coat films.

Drying can be carried out by using an oven, hot plate, infrared light, or the like. The drying temperature and drying period may be set as desired as long as the solvent can be volatilized, but it is preferable to set them in appropriate ranges so as to bring the photosensitive resin composition into an uncured or semicured state. Specifically, it is preferable to maintain a temperature in the range of 40° C. to 150° C. for 1 minute to several tens of minutes. It may also be good to adopt a combination of different temperatures in this range to perform heating in stages. For example, heat treatment may be performed at 80° C. and 90° C. for 2 minutes at each temperature.

Described next is a cured film formed by curing the photosensitive resin composition or the photosensitive sheet according to the present invention.

The cured film according to the present invention can be produced by heat-treating a photosensitive resin composition or a photosensitive sheet. The heat treatment temperature is only required to be in the range of 150° C. to 350° C. For instance, heat treatment for 5 minutes to 5 hours may be carried out by selecting appropriate temperatures and raising the temperature stepwise or by selecting an appropriate temperature range and raising the temperature continuously. As an example, heat treatment is performed at 130° C. and 200° C. for 30 minutes at each temperature. As a curing condition for the present invention, the lower temperature limit is preferably 170° C. or more, but it is more preferably 180° C. or more to ensure a sufficient degree of curing. The upper limit of curing temperature is not particularly limited, but it is preferably 280° C. or less, more preferably 250° C. or less, and still more preferably 230° C. or less, from the viewpoint of suppressing film shrinkage and stress.

Described next below is a method for forming a relief pattern on a cured film using the photosensitive resin composition or the photosensitive sheet according to the present invention.

The photosensitive resin composition according to the present invention is spread over a substrate, or the photosensitive sheet is laminated on a substrate. The substrate may be a metal copper plated substrate or a silicon wafer, and useful materials include, but not limited to, ceramics and gallium arsenide. Useful coating methods include spinning coating using a spinner, spray coating, and roll coating. The coating thickness depends on the coating method used, solid content in the composition, viscosity, and the like, but commonly, coating is performed in such a manner that the film thickness will be 0.1 to 150 μm after drying.

To ensure strong adhesion between the substrate and the photosensitive resin composition, the substrate may be pretreated with a silane coupling agent as described above. For example, a silane coupling agent is dissolved in a solvent such as isopropanol, ethanol, methanol, water, tetrahydrofuran, propylene glycol monomethyl ether acetate, propylene glycol monomethyl ether, ethyl lactate, and diethyl adipate to produce a solution with a concentration of 0.5 to 20 mass %. Then, the resulting solution is used to treat the surface of the substrate by spin coating, immersion, spray coating, steaming, or the like. In some cases, heat treatment is performed at 50° C. to 300° C. subsequently to accelerate the reaction between the substrate and the silane coupling agent.

Next, the substrate that is coated with the photosensitive resin composition or laminated with the photosensitive sheet is dried to form a photosensitive resin composition film. Drying is performed using an oven, hot plate, infrared light, or the like, and preferably continued in the temperature range of 50° C. to 150° C. for 1 minute to several hours. Here, the drying step may not be necessary in the case of using the photosensitive sheet.

Then, this photosensitive resin composition film is exposed to light. In this step, light exposure may be performed by applying an actinic ray through a mask having an intended pattern. Actinic rays useful for light exposure include ultraviolet ray, visible light, electron beam, and X-ray, but the i-line (365 nm), h-line (405 nm), and g-line (436 nm) of mercury lamps are preferable for the present invention.

Subsequently, this light-exposed photosensitive resin composition film may be subjected to a post-exposure baking (PEB) step as required. The PEB step is carried out using an oven, hot plate, infrared light, or the like, and preferably continued in the temperature range of 50° C. to 150° C. for 1 minute to several hours.

Next, the light-exposed photosensitive resin film is developed. To produce a pattern in resin, the light exposure step is followed by removing the exposed portion using a developer solution. The developer solution to be used for development is preferably a good solvent for the photosensitive resin composition or a mixture of a good solvent and a poor solvent therefor. Preferable examples for such a good solvent include N-methylpyrrolidone, N,N-dimethylacetamide, cyclopentanone, cyclohexanone, and γ-butyrolactone. Preferable examples for such a poor solvent include toluene, xylene, ethanol, isopropyl alcohol, ethyllactate, propylene glycol methyl ether acetate, and water. When using a mixture of a good solvent and a poor solvent, the proportion of the poor solvent to the good solvent is preferably adjusted depending on the solubility of the polymer component of the photosensitive resin composition. Furthermore, two or more, several for example, of each solvent type may be used in combination.

In addition, alkali solution development may be performed if the photosensitive resin composition is soluble in an alkali solution. A developer solution used for development works to dissolve and remove a polymer that is soluble in an alkali solution, and typically it is an aqueous alkaline solution containing a dissolved alkali compound. Examples of such an alkali compound include tetramethylammonium hydroxide, diethanolamine, diethylaminoethanol, sodium hydroxide, potassium hydroxide, sodium carbonate, and potassium carbonate. In some cases, such an aqueous alkali solution may contain polar solvents such as N-methyl-2-pyrrolidone, N,N-dimethylformamide, N,N-dimethylacetamide, dimethyl sulfoxide, and γ-butyrolactone; alcohols such as methanol, ethanol, and isopropanol; esters such as ethyl lactate and propylene glycol monomethyl ether acetate; and ketones such as cyclopentanone, cyclohexanone, and isobutyl ketone. These may be added singly or as a mixture of several ones thereof.

Washing with an organic solvent or rinsing with water is preferably performed after the development step. When using an organic solvent, ethylene glycol monomethyl ether acetate and propylene glycol monomethyl ether acetate are useful in addition to the developer solutions listed above. When using water, washing may be performed with a solution prepared by adding to water an alcohol such as ethanol and isopropyl alcohol or an ester such as ethyl lactate and propylene glycol monomethyl ether acetate.

Then, the developed photosensitive resin film is heat-treated. After the development step, heating is performed at a temperature of 150° C. to 350° C. to cause a thermal crosslinking reaction to cure the film. This heat treatment is performed for 5 minutes to 5 hours by stepwise heating at selected temperatures or continuous heating-up over a certain selected temperature range. As an example, heat treatment is performed at 130° C. and 200° C. for 30 minutes at each temperature. As a curing condition for the present invention, the lower temperature limit is preferably 170° C. or more, but it is more preferably 180° C. or more to ensure a sufficient degree of curing. The upper limit of curing temperature is not particularly limited, but it is preferably 280° C. or less, more preferably 250° C. or less, and still more preferably 230° C. or less, from the viewpoint of suppressing film shrinkage and stress.

An electronic component according to the present invention and a display device according to the present invention each include a cured film according to the present invention. Here, examples of the electronic component include active components having semiconductors such as transistors, diodes, integrated circuits (IC), and memories and passive components such as resistors, capacitors, and inductors.

In addition, packages of these components that are sealed to improve durability and modules that integrate a plurality of components are also regarded as electronic components. Some electronic components containing semiconductors may be sometimes called semiconductor devices or semiconductor packages. Furthermore, display panels and touch sensors are also in this category.

As specific examples of cured films incorporated in electronic components or display devices, they have been suitably used as passivation film for semiconductors, surface protection film for semiconductor elements and TFTs (thin film transistors), interlayer insulating film such as interlayer insulating film provided between redistribution layers in 2- to 10-layered multilayer wiring for high-density mounting, insulating film and protection film for touch screen displays, insulating films for organic electroluminescence (hereinafter abbreviated as EL) elements, flattening film for TFT substrate for driving display devices incorporating organic EL elements, on-chip microlens for solid state image sensors, and flattening film for various displays and solid state image sensors. Their applications are not limited thereto, and they can be modified in various other forms. In particular, interlayer insulating film in multilayer wiring for high-density mounting is a preferred application.

Next, a typical application of a cured film prepared by curing a photosensitive resin composition according to the present invention to a bumped semiconductor device is described below with reference to drawings. FIG. 1 is an enlarged cross-sectional view of a pad portion of a bumped semiconductor device according to the present invention. As seen in FIG. 1, an input/output aluminum (hereinafter abbreviated as Al) pad 2 exists on a silicon wafer 1, and a passivation film 3 are formed thereon, with a via hole formed in the passivation film 3. On top of this, a pattern of an insulating film 4 is formed as a cured film by curing the photosensitive resin composition according to the present invention, and a metal (Cr, Ti, etc.) film 5 is formed so that it connects to the Al pad 2, followed by forming a metal wiring (Al, Cu, etc.) 6 by electrolytic plating etc. For the metal layer 5, the peripheral region around the solder bump 10 are etched to achieve insulation between pads. A barrier metal 8 and a solder bump 10 are disposed on each insulated pad. The insulating film 7, which is a cured film produced by curing a photosensitive resin composition, can be subjected to thick film processing in the scribe line 9.

Figure 2:
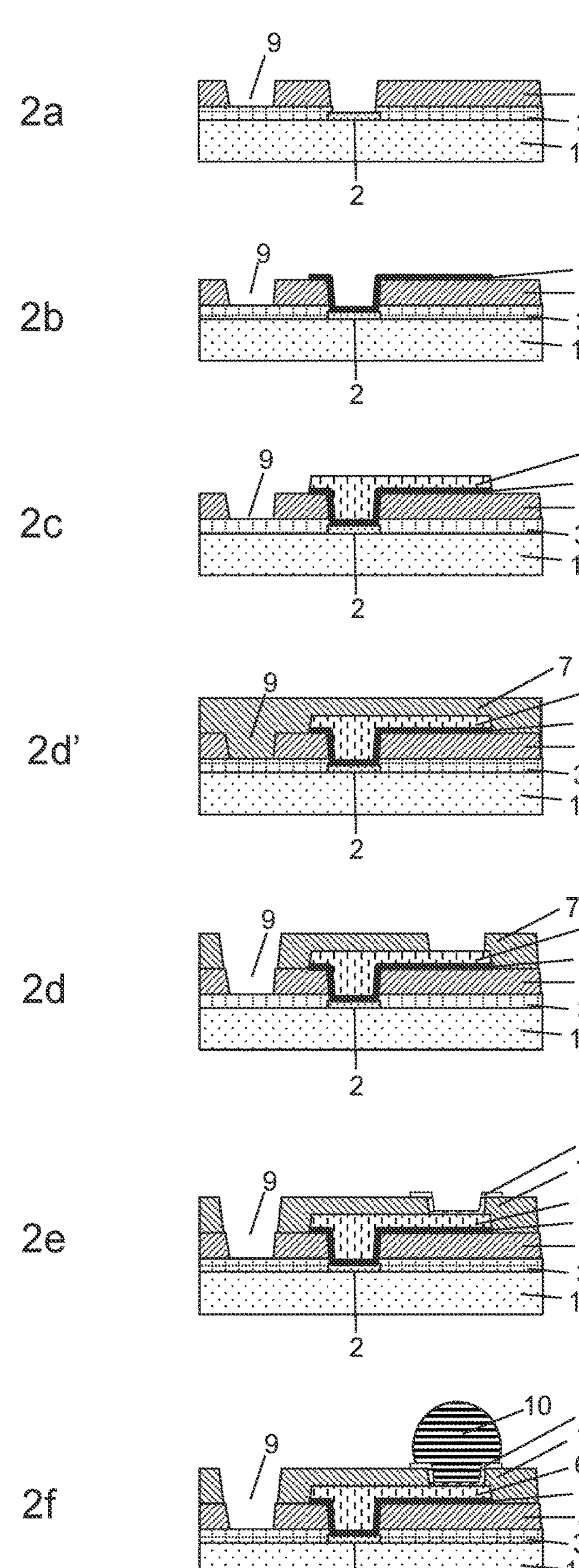
FIG. 2 This is a diagram detailedly illustrating a method for producing a bumped semiconductor device.

Next, a method for producing a semiconductor device is illustrated in detail in FIG. 2. As seen in the diagram 2*a* of FIG. 2, an input/output Al pad 2 is formed on a silicon wafer 1, and a passivation film 3 is formed thereon. Then a pattern of an insulating film 4 is formed as a cured film by curing the photosensitive resin composition according to the present invention. Subsequently, as seen in the diagram 2*b* of FIG. 2, a metal (Cr, Ti, etc.) film 5 is formed so that it connects to the Al pad 2, and as seen in the diagram 2*c* of FIG. 2, a metal wiring 6 is formed by plating. Then, as seen in the diagram 2*d*' of FIG. 2, the photosensitive resin composition according to the present invention, which is in an uncured state, is spread and processed in a photolithography step to form an insulating film 7 as a pattern as shown in the diagram 2*d* of FIG. 2. At this time, the insulating film 7, which is made of a photosensitive resin composition still in an uncured state, is subjected to thick film processing in the scribe line 9. To form a multi-layered structure having three or more wiring layers, the above steps are performed repeatedly to produce each of the layers.

Then, a barrier metal 8 and a solder bump 10 are formed as shown in the diagrams 2*e* and 3*f* of FIG. 2. Finally, the wafer is diced along the scribe line 9 into chips. If the insulating film 7 fails to form a pattern or leaves residue in the scribe line 9, cracks may occur in the dicing step, possibly having influence on the reliability evaluation of the chips. Therefore, if a pattern processing technique that can perform thick film processing accurately is provided, as in the case of the present invention, it is highly desirable in order to provide semiconductor devices with high reliability.

It is preferable for the antenna element according to the present invention to be an antenna element including at least one antenna wiring layer and a cured film according to the present invention wherein the antenna wiring layer contains at least one or more selected from the group consisting of meander type loop antenna, coil type loop antenna, meander type monopole antenna, meander type dipole antenna, and microstrip antenna; each antenna part in the antenna wiring layer has an exclusive area of 1,000 $mm^2$ or less; and the cured film is an insulating film for insulation between the ground and the antenna wiring layer.

Here, an antenna element is defined as an electronic component that uses passive components such as resistors, inductors, and capacitors to perform the function of transmitting and receiving radio waves. There are no specific limitations on the material to use in antenna wiring as long as it is conductive, and useful ones include metal materials such as copper, gold, silver, platinum, aluminum, molybdenum, and titanium. These may be in the form of a layered structure or alloy of different metals or in the form of a composite of a metal and an organic substance such as polymer. Furthermore, good materials also include carbon materials such as graphite, graphene, and carbon nanotube, as well as conductive polymers. Of these, copper is preferable because it is advantageous in terms of cost, electric conductivity, and stability.

Figure 3:
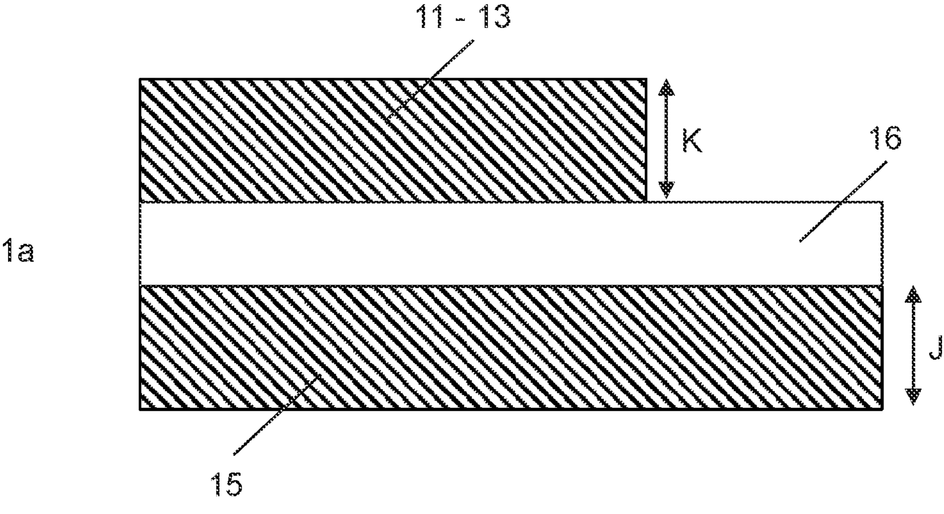
FIG. 3 is a schematic diagram of a coplanar waveguide-fed microstrip antenna, which is a kind of planar antenna.
Figure 3:
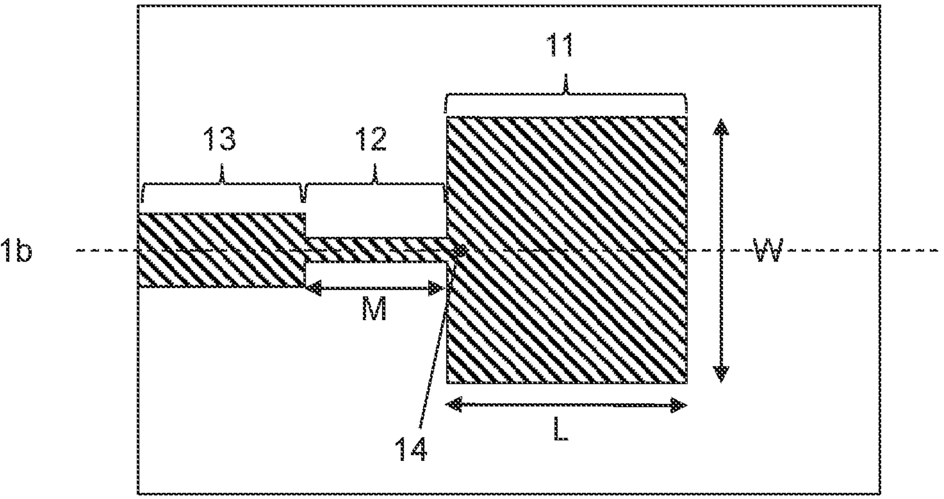

The antenna element according to the present invention is described in detail below with reference to FIG. 3. FIG. 3 is a schematic diagram of a coplanar waveguide-fed microstrip antenna, which is a kind of planar antenna. The diagram 1*a* is a cross-sectional view and the diagram 1*b* is a top view. The production method is described first. The photosensitive resin composition according to the present invention is spread over a copper foil sheet and prebaked, or an uncured photosensitive sheet is laminated with a copper foil sheet. Then, after the lamination with a copper foil sheet, it is heat-cured to form a cured film with both sides covered with copper foil sheets. Subsequently, patterning is performed by the subtraction method to form an antenna element with a copper wiring antenna pattern having a microstrip line (MSL) as illustrated in FIG. 3.

Described next is the antenna pattern shown in FIG. 3. In the diagram 1*a*, 15 denotes the ground (overall) and 16 denotes the insulating film that works as the substrate of the antenna. The layer 11 to 13 located above shows the cross section of the antenna wiring formed in the aforementioned patterning step. The ground wiring thickness J and the antenna wiring thickness K can be set as desired depending on the impedance design, but they are commonly in the range of 2 to 20 μm. In the diagram 1*b*, 11 is the antenna part; 12 is the matching circuit; 13 is the MSL feeder line; and 14 is the feeding point. To adjust the impedance matching between the antenna part 11 and the MSL feeder line 13, the length M of the matching circuit 12 is equal to ¼ λr (λr=(wavelength of transmitted wave)/(insulating material's dielectric constant)$^{1/2}$). Furthermore, the width W and length L of the antenna part 11 are designed to ½ λr. The length L of the antenna part may be less than ½ λr depending on the impedance design. The cured film according to the present invention is low in dielectric constant and low in dissipation factor, and this serves to provide an antenna element with a high efficiency and high gain. Due to these characteristics, furthermore, an antenna element incorporating the insulating film according to the present invention will work as an antenna suitable for high frequency applications, and it will be possible to produce a small antenna element by decreasing the antenna part size to an area (L×W) of 1,000 $mm^2$ or less. In this way, a small, high frequency antenna element with a high efficiency and high gain can be produced.

It is preferable for the semiconductor package according to the present invention to be a semiconductor package including at least a semiconductor element, a redistribution layer, a molding resin layer, and an antenna wiring layer, wherein the antenna wiring layer contains at least one or more selected from the group consisting of meander type loop antenna, coil type loop antenna, meander type monopole antenna, meander type dipole antenna, and microstrip antenna; each antenna part in the antenna wiring layer has an exclusive area of 1,000 $mm^2$ or less; the insulating layer in the redistribution layer and/or the molding resin layer contain the cured film according to the present invention; and the molding resin is located between the ground and the antenna wiring layer.

The materials listed above in the description of the antenna element can be useful also for the antenna wiring. Furthermore, the semiconductor element is, for example, an integrated circuit (RFIC) for processing signals transmitted and received by the antenna and may include semiconductor elements such as amplifier and noise filter. There are no specific limitations on the redistribution layer, but it preferably includes one to three metal wiring layers and one to four insulating layers from the viewpoint of cost and reliability. It is preferable for the insulating layer to be a cured film according to the present invention. The molding resin is preferably a cured film according to the present invention. When used in the insulating layer in the redistribution layer, however, there are no specific limitations thereon, and any appropriate molding material may be used. A mixture of an epoxy resin and an inorganic filler is commonly used.

Figure 4:
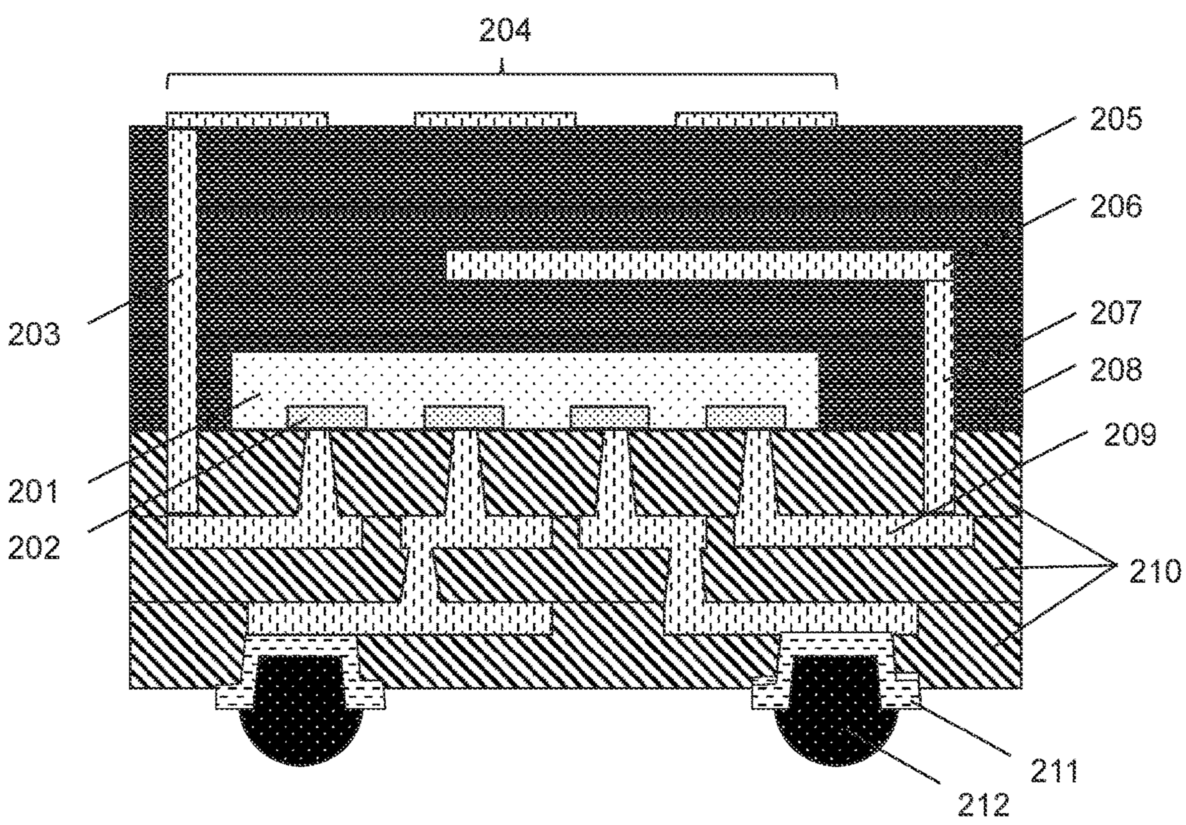
FIG. 4 is a schematic diagram showing a cross section of a semiconductor package that contains an IC chip (semiconductor element), a redistribution layer, a molding resin layer, and an antenna element.

Described next is a semiconductor package that includes an IC chip (semiconductor element), a redistribution layer, a molding resin layer, and an antenna wiring layer. FIG. 4 is a schematic diagram showing a cross section of a semiconductor package that includes an IC chip (semiconductor element), a redistribution layer, a molding resin layer, and an antenna element. On the electrode pad 202 of an IC chip 201, there is a redistribution layer (two copper layers and three insulating film layers) that includes copper wiring layers 209 and insulating films 210 made of the cured film according to the present invention. The pad for the redistribution layer (copper layers 209 and insulating films 210) has barrier metal members 211 and solder bumps 212. To seal the IC chip, a first molding resin layer 208 is laid using the cured film according to the present invention, and copper wiring layers 209 that work for grounding the antenna is formed on top thereof. Through a via hole formed in the first molding resin layer 208, a first via wiring 207 is formed to make a connection between the ground 206 and the redistribution layer (copper wiring layers 209 and insulating films 210). On the first molding resin layer 208 and the ground 206, a second molding resin layer 205 is formed using the cured film according to the present invention, and a planar antenna wiring 204 is formed on top thereof. Through a via hole formed in the first molding resin layer 208 and the second molding resin layer 205, a second via wiring 203 is formed to make a connection between the planar antenna wiring 204 and the redistribution layer (copper wiring layers 209 and insulating films 210). It is preferable for each of the insulating films 210 to have a thickness of 10 to 20 μm, and it is preferable for the first molding resin layer and the second molding resin layer to have a thickness of 50 to 200 μm and 100 to 400 μm, respectively. Since the cured film according to the present invention is low in dielectric constant and low in dissipation factor, a semiconductor package including the antenna element produced above is high in efficiency and high in gain, leading to a small transmittance loss in the package.

Furthermore, it is preferable for the antenna element according to present invention to be an antenna element that includes an antenna wiring layer formed on the cured film according to the present invention wherein the antenna wiring layer has a height of 50 to 200 μm and the cured film has a thickness of 80 to 300 μm. The layered structure of an antenna wiring layer and the cured film in which the antenna wiring layer and the cured film have a height and a thickness in the aforementioned ranges can perform transmission and reception of signals over a wide range in spite of a small size and provide an antenna element with a high efficiency and a high gain because the cured film according to the present invention is low in dielectric constant and low in dissipation factor.

EXAMPLES

The present invention will be described below with reference to examples, though the present invention is not limited to these examples. First, the evaluation procedures used in the examples and comparative examples are described. A photosensitive resin composition (hereinafter referred to as a varnish) filtered in advance through a polytetrafluoroethylene filter (manufactured by Sumitomo Electric Industries, Ltd.) with an average pore size of 1 μm was used for evaluations.

(1) Measurement of Molecular Weight

The weight average molecular weight (Mw) of the components (A1) to (A3) was measured using a GPC (gel permeation chromatography) apparatus (Waters 2690-996, manufactured by Nihon Waters K.K.). Measurement was performed using N-methyl-2-pyrrolidone (hereinafter abbreviated as NMP) as developing solvent, and the weight average molecular weight (Mw) in terms of polystyrene and the polydispersity index (PDI=Mw/Mn) were calculated.

(2) Pattern Processability (2)-1 Developing Property and Sensitivity

A varnish was spread by spin coating on a silicon wafer using a spin coater (1H-360S, manufactured by Mikasa Co., Ltd.) and prebaked on a hot plate (SCW-636, manufactured by Dainippon Screen Mfg. Co., Ltd.) at 120° C. for 3 minutes to prepare a prebaked film with a thickness of 11 μm. The resulting prebaked film was exposed to 1,000 mJ/cm$^2$ of light using a parallel light mask aligner (hereinafter abbreviated as PLA) (PLA-501F, manufactured by Canon Inc.) equipped with an ultrahigh pressure mercury lamp as light source (g-, h-, and i-line mixture) through a gray scale mask for sensitivity measurement (2 μm, 3 μm, 4 μm, 5 μm, 6 μm, 8 μm, 10 μm, 12.5 μm, 15 μm, 20 μm, 25 μm, 30 μm, 35 μm, 40 μm, and 50 μm, 1:1 line-space pattern, each having an area for transmittance of 1%, 5%, 10%, 12%, 14%, 16%, 18%, 20%, 22%, 25%, 30%, 35%, 40%, 50%, and 60%, respectively). Subsequently, post-exposure baking was performed at 120° C. for 3 minutes and then the film was developed using a coating/developing apparatus (MARK-7, manufactured by Tokyo Electron Ltd.). Shower development was performed for 30 seconds with cyclopentanone (CP) and then the film was washed for 15 seconds with propylene glycol monomethyl ether acetate (PGMEA). If the degree of development was too high or too low, it was adjusted by appropriately changing the development time and washing time.

Of all the exposure energy measurements taken at positions where the film thickness is 95% or more of the film thickness at the position exposed to 1,000 mJ of light, the minimum one is adopted as the optimum exposure energy. In addition, the film thickness at the position with the optimum exposure energy was divided by the prebaked film thickness and the quotient was adopted as residual film percentage. The sensitivity was evaluated according to the criterion specified below.

A: The residual film percentage is 90% or more.

B: The residual film percentage is 80% or more and less than 90%.

C: The residual film percentage is 70% or more and less than 80%.

D: The residual film percentage is 50% or more and less than 70%.

E: The residual film percentage is less than 50%.

Here, an illuminance meter was used to measure the exposure energy. Film thickness was measured using a Lambda Ace STM-602, manufactured by Dainippon Screen Mfg. Co., Ltd., under the condition of a refractive index of 1.629. The same device was used for the film thickness measurements taken below.

(2)-2 Resolution

The minimum pattern size after the development step was measured at the optimum exposure energy defined in the section (2)-1.

(3) Measurement of Dielectric Constant and Dissipation Factor

Using a coating/developing apparatus MARK-7, a varnish was applied to a 6 inch silicon wafer by spin coating in such a manner that the film thickness would be 11 μm after prebaking at 120° C. for 3 minutes, and then it was prebaked, followed by exposing the entire surface to 300 mJ/cm$^2$ of light in a PLA. Then, using an inert oven (CLH-21CD-S, manufactured by Koyo Thermo Systems Co., Ltd.), the temperature was raised to 220° C. at a rate of 3.5° C./min while maintaining the oxygen concentration at 20 ppm or less, and a heat treatment was performed at each temperature for 1 hour. The silicon wafer was taken out after cooling it to a temperature of 50° C. or less and immersed in 45 mass % hydrofluoric acid for 1 minutes, thereby removing the cured film of the resin composition from the wafer. This film was cut into a strip with a width of 1.5 cm and a length of 3 cm and subjected to measurement of dielectric constant and dissipation factor using a perturbation type cavity resonator according to ASTM D2520 at a frequency of 1 GHz in an atmosphere at room temperature of 23.0° C. and a humidity of 45.0% RH. Its dielectric property was evaluated according to a five stage criterion as shown in Table 1.

TABLE 1

| | dielectric constant | | |
|---|---|---|---|
| dielectric characteristics evaluation (1 GHz) dissipation factor | less than 3.1 | 3.1 or more less than 3.5 | 3.5 or more |
| less than 0.007 | A | B | C |
| 0.007 or more, less than 0.014 | B | C | D |
| 0.014 or more | C | D | E |

(4) Measurement of Glass Transition Temperature of Cured Film after Curing

A self-standing cured film was produced by the same procedure as described in the section "(3) Measurement of dielectric constant and dissipation factor", and this film was cut to a width of 0.5 cm and a length of 3.0 cm with a single-edged blade and subjected to measurement using a thermomechanical analyzer (TMA/SS6100, manufactured by Seiko Instruments Inc.), in which it was heated in a nitrogen flow of 80 mL/min from 25° C. to 400° C. at a rate of 10° C./min. The criterion used for evaluation was as shown below. A higher glass transition temperature shows that the cured film had a higher heat resistance.

A: The glass transition temperature is 200° C. or more.

B: The glass transition temperature is 180° C. or more and less than 200° C.

C: The glass transition temperature is 150° C. or more and less than 180° C.

D: The glass transition temperature is 120° C. or more and less than 150° C.

E: The glass transition temperature is less than 120° C.

(5) Measurement of Rupture Elongation of Cured Film after Curing

A self-standing cured film was produced by the same procedure as described in the section "(3) Measurement of dielectric constant and dissipation factor", and this film was cut into a strip with a width of 1.5 cm and a length of 9 cm. Using a Tensilon RTM-100 (manufactured by Orientec Co., Ltd.), measurement of rupture elongation (%) was performed by pulling the test piece at a tension speed of 50 mm/min (chuck-to-chuck distance 2 cm) in an atmosphere at room temperature of 23° C. and a relative humidity of 45.0%. Ten such strips were prepared from each sample and subjected to measurement. The five largest values were selected from the results and their average was calculated (number of significant digits: 3).

(6) Evaluation of Chemical Resistance

Using a coating/developing apparatus MARK-7, a varnish was applied to a silicon wafer by spin coating in such a manner that the film thickness would be 10 μm after prebaking at 120° C. for 3 minutes, and then it was prebaked, followed by exposing the entire surface of the film to 300 mJ/cm$^2$ of light in a PLA. Then, using an inert oven (CLH-21CD-S), the test piece was heated in a nitrogen flow up to 230° C. at a heating rate of 3.5° C./min while maintaining the oxygen concentration at 20 ppm or less, and a heat treatment was performed at 230° C. for 1 hour. The silicon wafer was taken out after cooling it to a temperature of 50° C. or less, and the cured film was immersed in an organic chemical solution (dimethylsulfoxide: 25% TMAHwater solution=92:2) at 65° C. for 60 minutes. It was observed to check for peeling and dissolution of the pattern. Based on the test results, a sample was rated as A if it suffered no peeling of the pattern and a film thickness change of 5% or less, rated as B if it suffered no peeling of the pattern and a film thickness change (which represents swelling or quantity of elution) of more than 5% and 10% or less, rated as C if it suffered no peeling of the pattern and a film thickness change of more than 10% and 20% or less, rated as D if it suffered no peeling of the pattern and a film thickness change of more than 20% and 30% or less, and rated as E if it suffered the disappearance of the film due to peeling of the pattern or a film thickness change of more than 30%.

Listed below are abbreviations of the compounds used in Synthesis examples and Examples.

ODPA: 3,3',4,4'-diphenylethertetracarboxylic dianhydride

6 FDA: 2,2-bis(2,3-dicarboxyphenyl) hexafluoropropane dianhydride

BSAA: 4,4'-(4,4'-isopropylidenediphenoxy) bis(phthalic acid)dianhydride

HPMDA: 1,2,4,5-cyclohexanetetracarboxylic dianhydride

PBOM: 1,1'-(4,4'-oxybenzoyl)diimidazole

DAE: 4,4'-diaminodiphenylether

TFMB: 2,2'-bis(trifluoromethyl)-4,4'-diaminobiphenyl

BAP: 2,2'-bis(3-amino-4-hydroxyphenyl)propane

Versamine 551: a dimer diamine compound containing a compound as represented by the formula (10) given above (trade name, manufactured by BASF) (average amine value: 205) Priamine 1075: a dimer diamine compound containing a compound as represented by the formula (9) given above (trade name, manufactured by Croda Japan K.K.) (average amine value: 205)

6FAP: bis(3-amino-4-hydroxyphenyl)hexafluoropropane

BIS-AT-AF: bis(3-amino-4-methylphenyl)hexafluoropropane

DACH: diaminocyclohexane

TAPOB-A: 1,3,5 trs-(4-aminophenoxy)benzene

MAP: m-aminophenol

MeA: methacrylic anhydride

GMA: glycidyl methacrylate

Karenz MOI: 2-methacryloyloxyethylisocyanate (trade name, manufactured by Showa Denko K.K.)

NCI-831: oxime ester based photopolymerization initiator (trade name, manufactured by Adeka Corporation)

IRGANOX 3114: hindered phenolic antioxidant (trade name, manufactured by BASF)

DCP-A: dicyclopentadiene dimethacrylate (trade name, manufactured by Kyoeisha Chemical Co., Ltd.)

4G: tetraethyleneglycoldimethacrylate (trade name, manufactured by Shin-Nakamura Chemical Co., Ltd.)

NIKALAC MW-100 LM: heat-crosslinker having an alkoxymethyl structure as represented by the chemical formula given below (trade name, manufactured by Sanwa Chemical Co., Ltd.)

[Chemical compound 34]

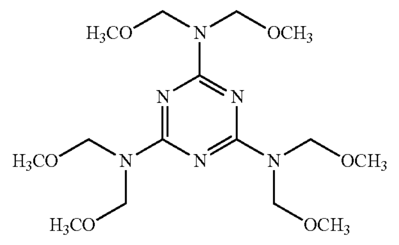

NNMP: N-methyl-2-pyrrolidone

THF: tetrahydrofuran

CP: cyclopentanone

PGMEA: propylene glycol methyl ether acetate

Polyflow 77: acrylic surfactant (trade name, manufactured by Kyoeisha Chemical Co., Ltd.)

Synthesis Example 1 Synthesis of Polyimide Resin (P-1)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 38.32 g (0.140 mol in terms of amino group) of Versamine 551 and 6FAP (9.16 g, 0.025 mol) were added together with 20 g of NMP, and the mixture was reacted at 60° C. for 2 hours. Subsequently, the temperature was raised to 200° C. and the reaction was maintained for 3 hours. Then, the temperature was decreased to 40° C., and 7.71 g (0.05 mol) of MeA was added together with 49.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-1).

Synthesis Example 2 Synthesis of Polyimide Precursor (P-2)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 38.32 g (0.140 mol in terms of amino group) of Versamine 551 and 6FAP (9.16 g, 0.025 mol) were added together with 20 g of NMP, and the mixture was reacted at 60° C. for 2 hours. Subsequently, a solution prepared by diluting 21.45 g (0.180 mol) of N,N-dimethylformamide dimethylacetal (manufactured by Mitsubishi Rayon Co., Ltd.) with 20 g of NMP was added dropwise over 10 minutes. After the dropping, stirring was performed at 60° C. for 3 hours. Then, the temperature was decreased to 40° C., and 7.71 g (0.05 mol) of MeA was added together with 29.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-2).

Synthesis Example 3 Synthesis of Polybenzoxazole Precursor (P-3)

In a dry nitrogen flow, 22.93 g (0.100 mol) of PBOM was dissolved in 234.67 g of NMP at 60° C. To this solution, 1.09 g (0.010 mol) of MAP was added together with 5 g of NMP, and the mixture was reacted at 85° C. for 15 minutes. Then, 38.32 g (0.140 mol in terms of amino group) of Versamine 551 and 9.16 g (0.025 mol) of 6FAP were added together with 20 g of NMP, and the mixture was reacted at 85° C. for 3 hours. Then, the temperature was decreased to 40° C., and 7.71 g (0.05 mol) of MeA was added together with 29.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air drier at 50° C. for 3 days to produce powder of polybenzoxazole precursor (P-3).

Synthesis Example 4 Synthesis of Polybenzoxazole Resin (P-4)

In a dry nitrogen flow, 22.93 g (0.100 mol) of PBOM was dissolved in 234.67 g of NMP at 60° C. To this solution, 1.09 g (0.010 mol) of MAP was added together with 5 g of NMP, and the mixture was reacted at 85° C. for 15 minutes. Then, 19.16 g (0.070 mol in terms of amino group) of Versamine 551 and 21.98 g (0.060 mol) of 6FAP were added together with 20 g of NMP, and the mixture was reacted at 85° C. for 3 hours. Subsequently, the temperature was raised to 200° C. and the reaction was maintained for 3 hours. Then, the temperature was decreased to 40° C., and 7.71 g (0.05 mol) of MeA was added together with 29.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air drier at 50° C. for 3 days to produce powder of polybenzoxazole resin (P-4).

Synthesis Example 5 Synthesis of Polyimide Resin (P-5)

Except for using Priamine 1075 instead of Versamine 551 adopted in Synthesis example 1, the same procedure as in Synthesis example 1 was carried out to produce polyimide resin (P-5).

Synthesis Example 6 Synthesis of Polyimide Resin (P-6)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 37.38 g (0.140 mol in terms of amino group) of Priamine 1075 and 9.16 g (0.025 mol) of 6FAP were added together with 20 g of NMP, and the mixture was reacted at 60° C. for 2 hours. Subsequently, the temperature was raised to 200° C. and the reaction was maintained for 3 hours. Then, the temperature was decreased to 40° C., and 7.11 g (0.05 mol) of GMA and 0.51 g (0.005 mol) of triethylamine were added together with 49.65 g of NMP in a pressurized air flow, and the reaction was maintained at 90° C. for 4 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-6).

Synthesis Example 7 Synthesis of Polyimide Resin (P-7)

Except for using Karenz MOI instead of MeA adopted in Synthesis example 1, the same procedure as in Synthesis example 1 was carried out to produce polyimide resin (P-7).

Synthesis Example 8 Synthesis of Diamine Compound TAPOB-A

In a dry nitrogen flow, 15.42 g (0.100 mol) of MeA and 221 g of THE were put in a 300 ml recovery flask and mixed together. To this mixture, a solution prepared by dissolving 39.95 g (0.100 mol) of TAPOB in 20 g of NMP was added dropwise. After the dropping, stirring was performed at 40° C. for 3 hours. After completion of the reaction, the reaction liquid and 300 g of a saturated aqueous solution of sodium bicarbonate were put in a separating funnel, and extraction operation was performed twice. After the extraction step, the reaction liquid was purified by alumina gel column chromatography and distilled under reduced pressure using a rotary evaporator to produce 30.38 g (yield 65%) of a viscous liquid of TAPOB-A.

[Chemical compound 35]

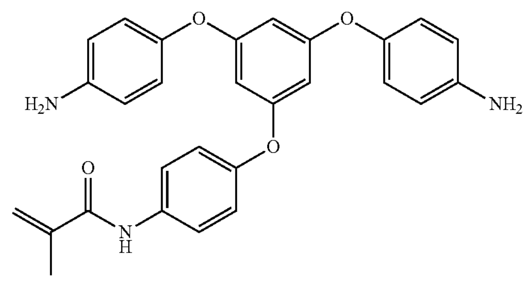

TAPOB-A

Synthesis Example 9 Synthesis of Polyimide Precursor (P-8)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 38.32 g (0.140 mol in terms of amino group) of Priamine 1075, 7.01 g (0.035 mol) of DAE, and 11.69 g (0.025 mol)

of TAPOB-A were added together with 20 g of NMP, and the mixture was reacted at 60° C. for 2 hours. Subsequently, a solution prepared by diluting 21.45 g (0.180 mol) of N,N-dimethylformamide dimethylacetal (manufactured by Mitsubishi Rayon Co., Ltd.) with 20 g of NMP was added dropwise over 10 minutes. After the dropping, stirring was performed at 60° C. for 3 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide precursor (P-8).

Synthesis Example 10 Synthesis of Polyimide Resin (P-9)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 19.16 g (0.07 mol in terms of amino group) of Priamine 1075 and 9.16 g (0.025 mol) of 6FAP were added together with 20 g of NMP, and the mixture was reacted at 60° C. for 2 hours. Subsequently, the temperature was raised to 200° C. and the reaction was maintained for 3 hours. Then, the temperature was decreased to 40° C., and 7.76 g (0.05 mol) of Karenz MOI was added together with 49.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-9).

Synthesis Example 11 to 15 Synthesis of Polyimide Resin (P-10) to (P-14)

The same procedure as in Synthesis example 10 was carried out according to the molar ratios shown in Table 2 given below to synthesize polyimide resins (P-10) to (P-14).

Synthesis Example 16 Synthesis of Polyimide Resin (P-15)

Except for using BAP instead of 6FAP adopted in Synthesis example 13, the same procedure as in Synthesis example 13 was carried out to produce polyimide resin (P-15).

Synthesis Example 17 Synthesis of Polyimide Resin (P-16)

In a dry nitrogen flow, 52.05 g (0.100 mol) of BSAA was dissolved in 234.67 g of NMP at 60° C. To this solution, 1.09 g (0.010 mol) of MAP was added together with 5 g of NMP, and the mixture was reacted at 60° C. for 15 minutes. Then, 8.21 g (0.07 mol in terms of amino group) of Priamine 1075, 11.01 g (0.055 mol) of DAE, and 9.16 g (0.025 mol) of 6FAP were added together with 20 g of NMP, and the mixture was reacted at 60° C. for 2 hours. Subsequently, the temperature was raised to 200° C. and the reaction was maintained for 3 hours. Then, the temperature was decreased to 40° C., and 7.76 g (0.05 mol) of Karenz MOI was added together with 49.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-16).

Synthesis Example 18 Synthesis of Polyimide Resin (P-17)

Except for using 6FDA instead of BSAA adopted in Synthesis example 17, the same procedure as in Synthesis example 16 was carried out to produce polyimide resin (P-17).

Synthesis Example 19 Synthesis of Polyimide Resin (P-18)

Except for using HPMDA instead of BSAA adopted in Synthesis example 17, the same procedure as in Synthesis example 16 was carried out to produce polyimide resin (P-18).

Synthesis Example 20 Synthesis of Polyimide Resin (P-19)

Except for using DACH instead of DAE adopted in Synthesis example 13, the same procedure as in Synthesis example 13 was carried out to produce polyimide resin (P-19).

Synthesis Example 21 Synthesis of Polyimide Resin (P-20)

Except for using TFMB instead of DAE adopted in Synthesis example 13, the same procedure as in Synthesis example 13 was carried out to produce polyimide resin (P-20).

Synthesis Example 22 Synthesis of Polyimide Resin (P-21)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 8.21 g (0.015 mol in terms of amino group) of Priamine 1075, 12.67 g (0.035 mol) of BIS-AT-AF, and 16.48 g (0.045 mol) of 6FAP were added together with 20 g of NMP, and the mixture was reacted at 60° C. for 2 hours. Subsequently, the temperature was raised to 200° C. and the reaction was maintained for 3 hours. Then, the temperature was decreased to 40° C., and 15.52 g (0.010 mol) of Karenz MOI was added together with 49.65 g of NMP in a pressurized air flow, and the reaction was maintained at 40° C. for 2 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-21).

Synthesis Examples 23 to 27 Synthesis of Polyimide Resin (P-22) to (P-26)

The same procedure as in Synthesis example 22 was carried out according to the molar ratios shown in Table 2 given below to synthesize polyimide resins (P-22) to (P-26).

Synthesis Example 28 Synthesis of Polyimide Resin (P-27)

In a dry nitrogen flow, 31.02 g (0.100 mol) of ODPA was dissolved in 234.67 g of NMP at 60° C. To this solution, 1.09 g (0.010 mol) of MAP was added together with 5 g of NMP, and the mixture was reacted at 60° C. for 15 minutes. Then, 38.32 g (0.140 mol in terms of amino group) of Versamine 551 and 9.16 g (0.025 mol) of 6FAP were added together with 20 g of NMP, and the mixture was reacted at 60° C. for 2 hours. Subsequently, the temperature was raised to 200° C. and the reaction was maintained for 3 hours. After completion of the reaction, the solution was cooled to room temperature and the solution was poured into 3 litters of water to produce a white precipitate. This precipitate was collected by filtration, rinsed with water three times, and dried in a forced-air dryer at 50° C. for 3 days to produce powder of polyimide resin (P-27).

Synthesis Example 29 Synthesis of Polyimide Resin (P-28)

Except for using DAE instead of Priamine 1075 adopted in Synthesis example 21, the same procedure as in Synthesis example 21 was carried out to produce polyimide resin (P-28).

Example 1

In a yellow light, 10.00 g of the polyimide resin (P-1), 0.5 g of NCI-831, 0.10 g of IRGANOX 3114, and 0.30 g of 3-trimethoxysilylphthalamic acid were dissolved in 18.96 g of NMP, and 0.10 g of an EL solution containing 1 mass % Polyflow 77 was added, followed by stirring to prepare a varnish. Characteristics such as pattern workability, dielectric constant, dissipation factor, and rupture elongation of the resulting varnish were measured by the evaluation methods described above.

Example 2

Except for replacing P-1 with P-2, the same procedure as in Example 1 was carried out.

Example 3

Except for replacing P-1 with P-3, the same procedure as in Example 1 was carried out.

Example 4

Except for replacing P-1 with P-4, the same procedure as in Example 1 was carried out.

Example 5

Except for replacing P-1 with P-5, the same procedure as in Example 1 was carried out.

Example 6

Except for replacing P-1 with P-6, the same procedure as in Example 1 was carried out.

Example 7

Except for replacing P-1 with P-7, the same procedure as in Example 1 was carried out.

Example 8

Except for replacing P-1 with P-8, the same procedure as in Example 1 was carried out.

Example 9

Except for replacing P-1 with P-9, the same procedure as in Example 1 was carried out.

Example 10

Except for replacing P-1 with P-10, the same procedure as in Example 1 was carried out.

Example 11

Except for replacing P-1 with P-11, the same procedure as in Example 1 was carried out.

Example 12

Except for replacing P-1 with P-12, the same procedure as in Example 1 was carried out.

Example 13

Except for replacing P-1 with P-13, the same procedure as in Example 1 was carried out.

Example 14

Except for replacing P-1 with P-14, the same procedure as in Example 1 was carried out.

Example 15

Except for replacing P-1 with P-15, the same procedure as in Example 1 was carried out.

Example 16

Except for replacing P-1 with P-16, the same procedure as in Example 1 was carried out.

Example 17

Except for replacing P-1 with P-17, the same procedure as in Example 1 was carried out.

Example 18

Except for replacing P-1 with P-18, the same procedure as in Example 1 was carried out.

Example 19

Except for replacing P-1 with P-19, the same procedure as in Example 1 was carried out.

Example 20

Except for replacing P-1 with P-20, the same procedure as in Example 1 was carried out.

Example 21

Except for replacing P-1 with P-21, the same procedure as in Example 1 was carried out.

Example 22

Except for replacing P-1 with P-22, the same procedure as in Example 1 was carried out.

Example 23

Except for replacing P-1 with P-23, the same procedure as in Example 1 was carried out.

Example 24

Except for replacing P-1 with P-24, the same procedure as in Example 1 was carried out.

Example 25

Except for replacing P-1 with P-25, the same procedure as in Example 1 was carried out.

Example 26

Except for replacing P-1 with P-26, the same procedure as in Example 1 was carried out.

Example 27

In a yellow light, 10.00 g of the polyimide resin (P-21), 0.5 g of NCI-831, 0.10 g of IRGANOX 3114, 0.30 g of 3-trimethoxysilylphthalamic acid, and 0.5 g of MW-100LM were dissolved in 18.96 g of NMP, and 0.10 g of an EL solution containing 1 mass % Polyflow 77 was added, followed by stirring to prepare a varnish. Characteristics such as pattern workability, dielectric constant, dissipation factor, and rupture elongation of the resulting varnish were measured by the evaluation methods described above.

Example 28

Except for replacing P-21 with P-23, the same procedure as in Example 27 was carried out.

Example 29

Except for replacing P-21 with P-25, the same procedure as in Example 27 was carried out.

Example 30

In a yellow light, 8.00 g of the polyimide resin (P-16), 2.00 g of 4G, 0.5 g of NCI-831, 0.10 g of IRGANOX 3114, and 0.30 g of 3-trimethoxysilylphthalamic acid were dissolved in 18.96 g of NMP, and 0.10 g of an EL solution containing 1 mass % Polyflow 77 was added, followed by stirring to prepare a varnish. Characteristics such as pattern workability, dielectric constant, dissipation factor, and rupture elongation of the resulting varnish were measured by the evaluation methods described above.

Example 31

Except for replacing 4G with DCP-A, the same procedure as in Example 30 was carried out.

Comparative Example 1

Except for replacing P-1 with P-28, the same procedure as in Example 1 was carried out.

Comparative Example 2

Except for replacing P-1 with P-29, the same procedure as in Example 1 was carried out.

The components used and evaluation results obtained in Examples and Comparative examples are given in Table 2 to Table 4.

TABLE 2

| | | | | | | carboxylic acid | diamine | | | | |
|---|---|---|---|---|---|---|---|---|---|---|---|
| | | acid anhydride | | | | derivative | Versamine | Priamine | | | |
| | | SSAA | 6FDA | HPMDA | ODPA | PBOM | 551 | 1075 | DAE | DACH | 6 FAP |
| resin (A) | structure | molar ratio | | | | | | | | | |
| Synthesis example 1 P-1 | polyimide | | | | 100 | | 70 | | | | 25 |
| Synthesis example 2 P-2 | polyimide precursor | | | | 100 | | 70 | | | | 25 |
| Synthesis example 3 P-3 | polybenzo-oxazolepre-cursor | | | | | 100 | 70 | | | | 25 |
| Synthesis example 4 P-4 | polybenzox-azole | | | | | 100 | 35 | | | | 80 |
| Synthesis example 5 P-5 | polyimide | | | | 100 | | | 70 | | | 25 |
| Synthesis example 6 p-6 | polyimide | | | | 100 | | | 70 | | | 25 |
| Synthesis example 7 P-7 | polyimide | | | | 100 | | | 70 | | | 25 |
| Synthesis example 9 P-8 | polyimide precursor | | | | 190 | | | 70 | | | |
| Synthesis example 10 P-9 | polyimide | | | | 100 | | | 35 | 35 | | 25 |
| Synthesis example 11 P-10 | polyimide | | | | 100 | | | 25 | 45 | | 25 |
| Synthesis example 12 P-11 | polyimide | | | | 100 | | | 20 | 50 | | 25 |
| Synthesis example 13 P-12 | polyimide | | | | 100 | | | 15 | 55 | | 25 |

TABLE 2-continued

| | | | | | | | | | | | |
|---|---|---|---|---|---|---|---|---|---|---|---|
| Synthesis example 14 | P-13 | pulyimide | | | | 100 | | 10 | 80 | | 25 |
| Synthesis example 15 | P-14 | polyimide | | | | 100 | | 5 | 65 | | 25 |
| Synthesis example 16 | P-15 | polyimide | | | | 100 | | 15 | 55 | | |
| Synthesis example 17 | P-16 | polyimide | 100 | | | | | 15 | 55 | | 25 |
| Synthesis example 18 | P-17 | polyimide | | 100 | | | | 15 | 55 | | 25 |
| Synthesis example 19 | P-18 | polyimide | | | 100 | | | 15 | 55 | | 25 |
| Synthesis example 20 | P-19 | polyimide | | | | 100 | | 15 | | 55 | 25 |
| Synthesis example 21 | P-20 | polyimide | | | | 100 | | 15 | | | 25 |
| Synthesis example 22 | P-21 | polyimide | | | | 100 | | 15 | | | 25 |
| Synthesis example 23 | P-22 | polyimide | | | | 100 | | 15 | | | 30 |
| Synthesis example 24 | P-23 | polyimide | | | | 100 | | 15 | | | 35 |
| Synthesis example 25 | P-24 | polyimide | | | | 100 | | 15 | | | 40 |
| Synthesis example 26 | P-25 | polyimide | | | | 100 | | 15 | | | 45 |
| Synthesis example 27 | P-26 | polyimide | | | | 100 | | 15 | | | 55 |
| Synthesis example 28 | P-27 | polyimide | | | | 100 | 70 | | | | 25 |
| Synthesis example 29 | P-28 | polyimide | | | | 100 | | | 15 | | 25 |

| resin (A) | | structure | diamine BAP | TFME | BIS-AT-AF | TAPOB-A | chain end MAP | side chain MeA | GMA | Karenz MOI | molecular weight Mw | PDI |
|---|---|---|---|---|---|---|---|---|---|---|---|---|
| | | | | | | | molar ratio— | | | | — | — |
| Synthesis example 1 | P-1 | polyimide | | | | | 10 | 50 | | | 27000 | 2.9 |
| Synthesis example 2 | P-2 | polyimide precursor | | | | | 10 | 50 | | | 25000 | 2.7 |
| Synthesis example 3 | P-3 | polybenzo-oxazolepre-cursor | | | | | 10 | 50 | | | 28000 | 2.7 |
| Synthesis example 4 | P-4 | polybenzox-azole | | | | | 10 | 50 | | | 20000 | 2.9 |
| Synthesis example 5 | P-5 | polyimide | | | | | 10 | 50 | | | 26000 | 2.5 |
| Synthesis example 6 | p-6 | polyimide | | | | | 10 | | 50 | | 25000 | 2.8 |
| Synthesis example 7 | P-7 | polyimide | | | | | 10 | | | 50 | 27000 | 2.6 |
| Synthesis example 9 | P-8 | polyimide precursor | | | | 25 | 10 | | | | 26000 | 2.5 |
| Synthesis example 10 | P-9 | polyimide | | | | | 10 | | | 50 | 30000 | 2.7 |
| Synthesis example 11 | P-10 | polyimide | | | | | 10 | | | 50 | 31000 | 2 G |
| Synthesis example 12 | P-11 | polyimide | | | | | 10 | | | 50 | 32000 | 2.8 |
| Synthesis example 13 | P-12 | polyimide | | | | | 10 | | | 50 | 32000 | 2.8 |
| Synthesis example 14 | P-13 | pulyimide | | | | | 19 | | | 50 | 32000 | 2.7 |
| Synthesis example 15 | P-14 | polyimide | | | | | 10 | | | 50 | 33000 | 2.8 |
| Synthesis example 16 | P-15 | polyimide | 25 | | | | 10 | | | 50 | 32000 | 2.9 |
| Synthesis example 17 | P-16 | polyimide | | | | | 10 | | | 50 | 30000 | 2.6 |
| Synthesis example 18 | P-17 | polyimide | | | | | 10 | | | 50 | 29000 | 2.9 |
| Synthesis example 19 | P-18 | polyimide | | | | | 10 | | | 50 | 24000 | 7 7 |
| Synthesis example 20 | P-19 | polyimide | | | | | 10 | | | 50 | 21000 | 2.7 |
| Synthesis example 21 | P-20 | polyimide | | 55 | | | 10 | | | 50 | 23000 | 2.6 |
| Synthesis example 22 | P-21 | polyimide | | | 55 | | 10 | | | 60 | 25000 | 2.7 |
| Synthesis example 23 | P-22 | polyimide | | | 50 | | 10 | | | 60 | 25000 | 2.8 |
| Synthesis example 24 | P-23 | polyimide | | | 45 | | 10 | | | 60 | 26000 | 2.8 |
| Synthesis example 25 | P-24 | polyimide | | | 40 | | 10 | | | 60 | 26000 | 2.7 |
| Synthesis example 26 | P-25 | polyimide | | | 35 | | 10 | | | 60 | 24000 | 2.8 |
| Synthesis example 27 | P-26 | polyimide | | | 25 | | 10 | | | 60 | 25000 | 2.7 |
| Synthesis example 28 | P-27 | polyimide | | | | | | | | | 25000 | 2.7 |
| Synthesis example 29 | P-28 | polyimide | | 55 | | | 10 | | | 50 | 25000 | 2.6 |

TABLE 3-1

| | varnish compositions other than solvent (parts by mass) Component (A) | Component (B) | Component (C) | Component (D) | other components |
|---|---|---|---|---|---|
| Example 1 | P-1(100) | NCI-831 (5) | — | — | 3-trimethoxysilyiphthalamic acid (3) Polyflow 77 (0.01) |
| Example 2 | P-2(100) | NCI-831 (5) | — | — | 3-trimethoxysilyiphthalamic acid (3) Polyflow 77 (0.01) |
| Example 3 | P-3(100) | NCI-831 (5) | — | — | 3-trimethoxysilyiphthalamic acid (3) Polyflow 77 (0.01) |
| Example 4 | P-4(100) | NCI-831 (5) | — | — | 3-trimethoxysilyiphthalamic acid (3) Polyflow 77 (0.01) |
| Example 5 | P-5(100) | NCI-831 (5) | — | — | 3-trimethoxysilyiphthalamic acid (3) Polyflow 77 (0.01) |
| Example 6 | P-6(100) | NCI-831 (5) | — | — | 3-trimethoxysilyiphthalamic acid (3) Polyflow 77 (0.01) |

TABLE 3-1-continued

| | varnish compositions other than solvent (parts by mass) | | | | |
|---|---|---|---|---|---|
| | Component (A) | Component (B) | Component (C) | Component (D) | other components |
| Example 7 | P-7(100) | NCI-831 (5) | — | — | 3-trimethoxysilyiphthalamic acid (3)<br>Polyflow 77 (0.01) |
| Example 8 | P-8(100) | NCI-831 (5) | — | — | 3-trimethoxysilyiphthalamic acid (3)<br>Polyflow 77 (0.01) |
| Example 9 | P-9(100) | NCI-831 (5) | — | — | 3-trimeihoxysilylphthalamic acid (3)<br>Polyflow 77 (0.01) |
| Example 10 | P-10(100) | NCI-831 (5) | — | — | 3-trimethoxysilyiphthalamic acid (3)<br>Polyflow 77 (0.01) |
| Example 11 | P-11(100) | NCI-831 (5) | — | — | 3-trimethoxysilyiphthalamic acid (3)<br>Polyflow 77 (0.01) |
| Example 12 | P-12(100) | NCI-831 (5) | — | — | 3-trimethoxysilyiphthalamic acid (3)<br>Polyflow 77 (0.01) |
| Example 13 | P-13(100) | NCI-831 (5) | — | — | 3-trimeihoxysilylphthalamic acid (3)<br>Polyflow 77 (0.01) |
| Example 14 | P-14(100) | NCI-831 (5) | — | — | 3-trimethoxysilyiphthalamic acid (3)<br>Polyflow 77 (0.01) |
| Example 15 | P-15(100) | NCI-831 (5) | — | — | 3-trimethoxysilyiphthalamic acid (3)<br>Polyflow 77 (0.01) |
| Example 16 | P-16(100) | NCI-831 (5) | — | — | 3-trimethoxysilyphthalamic acid (3)<br>Polyflow 77 (0.01) |
| Example 17 | P-17(100) | NCI-831 (5) | — | — | 3-trimethoxysilylphthalamic acid (3)<br>Polyflow 77 (0.01) |
| Example 18 | P-18(100) | NCI-831 (5) | — | — | 3-trimethoxysilylphthalamic acid (3)<br>Polyflow 77 (0.01) |
| Example 19 | P-19(100) | NCI-831 (5) | — | — | 3-trimethoxysilylphthalamic acid (3)<br>Polyflow 77 (0.01) |
| Example 20 | P-20(100) | NCI-831 (5) | — | — | 3-trimethoxysilylphthalamic acid (3)<br>Polyflow 77 (0.01) |
| Example 21 | P-21(100) | NCI-831 (5) | — | — | 3-trimethoxysilylphthalamic acid (3)<br>Polyflow 77 (0.01) |
| Example 22 | P-22(100) | NCI-831 (5) | — | — | 3-trimethoxysilylphthalamic acid (3)<br>Polyflow 77 (0.01) |
| Example 23 | P-23(100) | NCI-831 (5) | — | — | 3-trimethoxysilylphthalamic acid (3)<br>Polyflow 77 (0.01) |
| Example 24 | P-24(100) | NCI-831 (5) | — | — | 3-trimethoxysilylphthalamic acid (3)<br>Polyflow 77 (0.01) |
| Example 25 | P-25(100) | NCI-831 (5) | — | — | 3-trimethoxysilyiphthalamic acid (3)<br>Polyflow 77 (0.01) |
| Example 26 | P-26(100) | NCI-831 (5) | — | — | 3-trimethoxysilyiphthalamic acid (3)<br>Polyflow 77 (0.01) |
| Example 27 | P-21(100) | NCI-831 (5) | — | NIKALAC MW-100LM (5) | 3-trimethoxysilylphthalamic acid (3)<br>Polyflow 77 (0.01) |
| Example 28 | P-23(100) | NCI-831 (5) | — | NIKALAC MW-100LM (5) | 3-trimethoxysilylphthalamic acid (3)<br>Polyflow 77 (0.01) |
| Example 29 | P-25(100) | NCI-831 (5) | — | NIKALAC MW-100LM (5) | 3-trimethoxysilylphthalamic acid (3)<br>Polyflow 77 (0.01) |
| Example 30 | P-16(80) | NCI-831 (5) | 4G(20) | — | 3-trimethoxysilylphthalamic acid (3)<br>Polyflow 77 (0.01) |
| Example 31 | P-16(80) | NCI-831 (5) | DCP-A(20) | — | 3-trimethoxysilylphthalamic acid (3)<br>Polyflow 77 (0.01) |
| Comparative example 1 | P-28(100) | NCI-831 (5) | — | — | 3-trimethoxysilyiphthalamic acid (3)<br>Polyflow 77 (0.01) |
| Comparative example 2 | P-29(100) | NCI-831 (5) | — | — | 3-trimethoxysilylphthalamic acid (3)<br>Polyflow 77 (0.01) |

TABLE 4

| | evaluation results | | | | | | | | | | |
|---|---|---|---|---|---|---|---|---|---|---|---|
| | pattern processability | | | | | | | glass transition temperature | | | |
| | optimum exposure energy ($mJ/cm^2$) | residual film percentage (%) | sensitivity | resolution (μm) | dielectric characteristics (1 GHz) dielectric constant | dissipation factor | evaluation | glass transition temperature (° C.) | evaluation | rupture elongation (%) | chemical resistance evaluation |
| Example 1 | 500 | 60 | D | 35 | 2.7 | 0.003 | A | 130 | D | 150 | C |
| Example 2 | 500 | 55 | D | 35 | 2.7 | 0.004 | A | 130 | D | 140 | C |
| Example 3 | 500 | 50 | D | 35 | 2.8 | 0.004 | A | 120 | D | 120 | C |

TABLE 4-continued

| | evaluation results | | | | | | | | | | |
|---|---|---|---|---|---|---|---|---|---|---|---|
| | pattern processability | | | | | | | glass transition temperature | | | |
| | optimum exposure energy (mJ/cm$^2$) | residual film percentage (%) | sensitivity | resolution (μm) | dielectric characteristics (1 GHz) dielectric constant | dissipation factor | evaluation | glass transition temperature (° C.) | evaluation | rupture elongation (%) | chemical resistance evaluation |
| Example 4 | 500 | 50 | D | 35 | 3.0 | 0.009 | B | 155 | D | 100 | C |
| Example 5 | 400 | 70 | C | 30 | 2.7 | 0.003 | A | 130 | D | 170 | C |
| Example 6 | 350 | 80 | B | 25 | 3.0 | 0.006 | A | 150 | C | 130 | C |
| Example 7 | 350 | 85 | B | 25 | 2.9 | 0.005 | A | 145 | D | 140 | C |
| Example 8 | 350 | an | A | 20 | 3.0 | 0.003 | A | 140 | D | 140 | C |
| Example 9 | 300 | 83 | B | 25 | 3.1 | 0.005 | B | 155 | C | 120 | B |
| Example 10 | 300 | 84 | B | 20 | 3.2 | 0.006 | B | 170 | C | 90.0 | B |
| Example 11 | 300 | 85 | B | 20 | 3.2 | 0,006 | B | 175 | C | 80.0 | B |
| Example 12 | 250 | 87 | B | 20 | 3.3 | 0.006 | B | 180 | B | 70.0 | B |
| Example 13 | 250 | 87 | B | 20 | 3.3 | 0.008 | C | 190 | B | 70.0 | B |
| Example 14 | 250 | 88 | B | 20 | 3.4 | 0.01 | C | 200 | A | 60.0 | B |
| Example 15 | 300 | 86 | B | 20 | 3.5 | 0.006 | C | 180 | B | 75.0 | B |
| Example 16 | 250 | 85 | B | 20 | 3.0 | 0.003 | A | 130 | B | 90.0 | B |
| Example 17 | 250 | 85 | B | 20 | 2.9 | 0.005 | A | 100 | B | 60.0 | B |
| Example 18 | 250 | 80 | B | 20 | 2.8 | 0.003 | A | 190 | B | 60.0 | B |
| Example 19 | 250 | 85 | B | 20 | 2.8 | 0.003 | A | 190 | B | 80.0 | B |
| Example 20 | 250 | 88 | B | 20 | 2.8 | 0.002 | A | 210 | A | 90.0 | B |
| Example 21 | 250 | 85 | B | 20 | 3.0 | 0.004 | A | 180 | B | 70.0 | B |
| Example 22 | 250 | 85 | B | 20 | 3.0 | 0.004 | A | 200 | A | 70.0 | B |
| Example 23 | 250 | 84 | B | 20 | 3.0 | 0.004 | A | 205 | A | 70.0 | B |
| Example 24 | 250 | 84 | B | 20 | 3.0 | 0.005 | A | 210 | A | 60.0 | B |
| Example 25 | 250 | 84 | B | 20 | 3.1 | 0.005 | B | 220 | A | 60.0 | B |
| Example 26 | 250 | 83 | B | 20 | 3.3 | 0.007 | C | 225 | A | 60.0 | B |
| Example 27 | 250 | 84 | B | 20 | 3.1 | 0.005 | B | 185 | B | 60.0 | B |
| Example 28 | 250 | 83 | B | 20 | 3.1 | 0.005 | B | 215 | A | 60.0 | A |
| Example 29 | 250 | 83 | B | 20 | 3.2 | 0.007 | C | 230 | A | 50.0 | A |
| Example 27 | 300 | 92 | A | 25 | 3.3 | 0.009 | C | 170 | C | 80.0 | B |
| Example 28 | 250 | 90 | A | 20 | 3.1 | 0.006 | B | 190 | B | 80.0 | B |
| Comparative example 1 | | pattern processing impossible | | | 2.8 | 0.005 | A | 120 | E | 160 | E |
| Comparative example 2 | 350 | 80 | B | 20 | 3.3 | 0.015 | D | 210 | A | 50.0 | B |

EXPLANATION OF NUMERALS

1 silicon wafer
2 Al pad
3 passivation film
4 insulating film
5 metal (Cr, Ti, etc.) film
6 metal wiring (Al, Cu, etc.)
7 insulating film
8 barrier metal
9 scribe line
10 solder bump
11 antenna part
12 matching circuit
13 MSL feeder line
14 feeding point
15 ground
16 insulating film
J thickness of ground wiring
K thickness of antenna wiring
M length of matching circuit
L length of antenna part
W width of antenna part
201 IC chip
202 electrode pad
203 second via wiring
204 planar antenna wiring
205 second molding resin
206 ground
207 first via wiring
208 first molding resin
209 copper wiring
210 insulating film
211 barrier metal
212 solder bump

The invention claimed is:

1. A photosensitive resin composition comprising a resin (A3) and a photopolymerization initiator (B), the resin (A3) containing one or more structural units represented by any of the following formula (1), formula (3), and formula (5), and the resin further containing one or more structural represented by any of the following formula (2), formula (4), and formula (6):

(1)

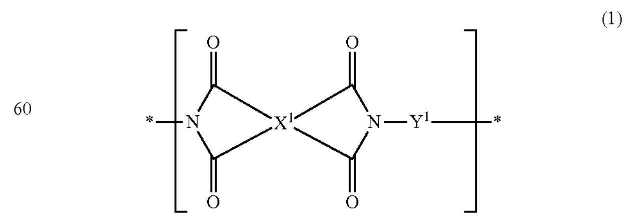

wherein in formula (1), $X^1$ denotes a tetravalent organic group containing 2 to 60 carbon atoms; $Y^1$ denotes a divalent organic group containing 2 to 70 carbon atoms; at least either $X^1$ or $Y^1$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point;

(2)

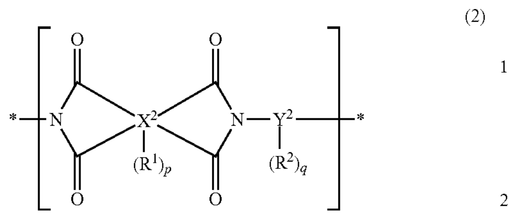

wherein in formula (2), $X^2$ denotes a tetravalent to hexavalent organic group containing 2 to 60 carbon atoms; $Y^2$ denotes a divalent to hexavalent organic group containing 2 to 70 carbon atoms; $R^1$'s and $R^2$'s each independently denote a carboxyl group, a hydroxyl group, or a monovalent organic group containing 3 to 30 carbon atoms and having an ethylenically unsaturated bond; at least one of $R^1$'s and $R^2$'s is a monovalent organic group containing 3 to 30 carbon atoms and having an ethylenically unsaturated bond; p denotes an integer of 0 to 2; q denotes an integer of 0 to 4; the relation $1 \leq p+q \leq 6$ holds; and * denotes a bonding point;

(3)

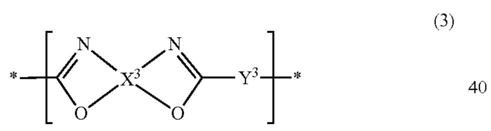

wherein in formula (3), $X^3$ denotes a tetravalent organic group containing 2 to 60 carbon atoms; $Y^3$ denotes a divalent organic group containing 2 to 70 carbon atoms; at least either $X^3$ or $Y^3$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point;

(4)

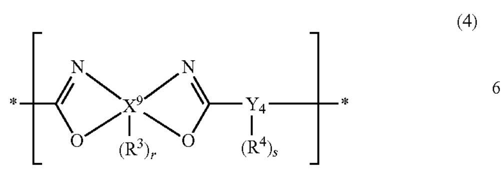

wherein in formula (4), $X^4$ denotes a tetravalent to hexavalent organic group containing 2 to 60 carbon atoms; $Y^4$ denotes a divalent to hexavalent organic group containing 2 to 70 carbon atoms; $R^3$'s and $R^4$'s may be identical to or different from each other and each independently denote a carboxyl group, a hydroxyl group, or a monovalent organic group containing 3 to 30 carbon atoms and having an ethylenically unsaturated bond; at least one of $R^3$'s and $R^4$'s is a monovalent organic group containing 3 to 30 carbon atoms and having an ethylenically unsaturated bond; r denotes an integer of 0 to 2; s denotes an integer of 0 to 4; the relation $1 \leq r+s \leq 6$ holds, and * denotes a bonding point;

(5)

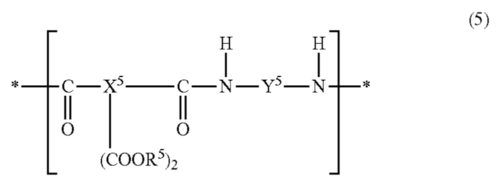

wherein in formula (5), $X^5$ denotes a tetravalent organic group containing 2 to 60 carbon atoms; $Y^5$ denotes a divalent organic group containing 2 to 70 carbon atoms; at least either $X^5$ or $Y^5$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; ($COOR^5$) is a substituent group located at a position where it can form an imide ring with an amide group bonded to $X^5$; $R^5$ denotes a hydrogen atom or an organic group containing 1 to 5 carbon atoms; and * denotes a bonding point;

(6)

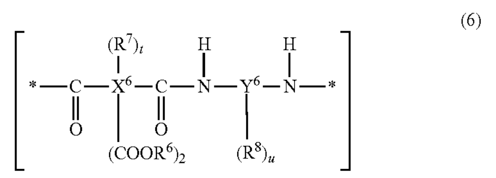

wherein in formula (6), $X^6$ denotes a tetravalent to hexavalent organic group containing 2 to 60 carbon atoms; $Y^6$ denotes a divalent to hexavalent organic group containing 2 to 70 carbon atoms; ($COOR^6$) is a substituent group located at a position where it can form an imide ring with an amide group bonded to $X^6$; $R^6$ is a hydrogen atom or an organic group containing 1 to 5 carbon atoms; $R^7$ is a hydroxyl group or a monovalent organic group containing 3 to 30 carbon atoms and having an ethylenically unsaturated bond; $R^8$ is a carboxyl group, a hydroxyl group, or a monovalent organic group containing 3 to 30 carbon atoms and having an ethylenically unsaturated bond; at least one of $R^7$'s and $R^8$'s contains 3 to 30 carbon atoms and having an ethylenically unsaturated bond; t denotes an integer of 0 to 2; u denotes an integer of 0 to 4; the relation $1 \leq t+u \leq 6$ holds; and * denotes a bonding point;

wherein at least one of the structural units represented by formula (1), (3), or (5) accounts for 1 to 30 mol % relative to all structural units, which accounts for 100 mol %, in the resin (A3); and wherein the structure of the resin (A3) contains a fluorine component.

2. The photosensitive resin composition as set forth in claim 1, wherein $Y^1$ in the formula (1), $Y^3$ in the formula (3), and $Y^5$ in the formula (5) are each a multivalent amine residue as represented by the following formula (7):

(7)

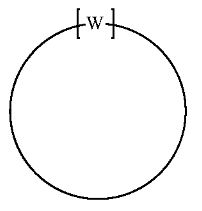

(7a)

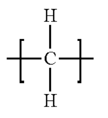

(7b)

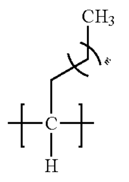

(7c)

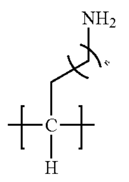

wherein in the formula (7), 1 denotes an integer of 4 to 8; W's each independently denote a structural unit as represented by the formula (7a), (7b), or (7c); two or more of the 1 W's are structural units of (7c); the sum of the number of structural units of (7b) and that of (7c) is 4 or more and 8 or less, and m and n are each independently an integer of 3 to 11.

3. The photosensitive resin composition as set forth in claim 1, wherein $Y^1$ in the formula (1), $Y^3$ in the formula (3), and $Y^5$ in the formula (5) are each a diamine residue as represented by the following formula (9):

(9)

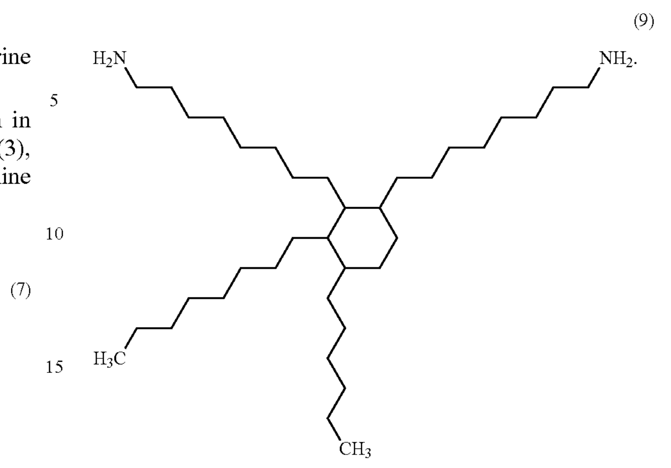

4. The photosensitive resin composition as set forth in claim 1, wherein:

when the resin (A3) contains a structural unit as represented by the formula (2) given above, at least one of $R^1$'s and $R^2$'s is a group as represented by the following formula (12) or the following formula (13);

when the resin (A3) contains a structural unit as represented by the formula (4) given above, at least one of $R^3$'s and $R^4$'s is a group as represented by the formula (12) or the formula (13), and when the resin (A3) contains a structural unit as represented by the formula (6) given above, at least one of $R^7$'s and $R^8$'s is a group as represented by the formula (12) or the formula (13);

(12)

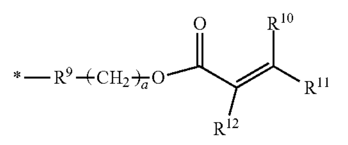

wherein in the formula (12), $R^9$ is a linking group of $—OCH_2CH(OH)—$, $—OCONH—$, $—NHCH_2CH(OH)—$, or $—NHCONH—$; $R^{10}$, $R^{11}$, and $R^{12}$ are each a hydrogen atom, a methyl group, an ethyl group, or a propyl group; a is an integer of 1 to 10; and * denotes a bonding point, (13)

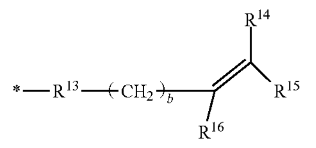

wherein in the formula (13), $R^{13}$ is a linking group of $—OCO—$ or $—NHCO—$; $R^{14}$, $R^{15}$, and $R^{16}$ are each a hydrogen atom, a methyl group, an ethyl group, or a propyl group; b is an integer of 0 to 10; and * denotes a bonding point.

5. The photosensitive resin composition as set forth in claim 1, wherein at least two selected from the group consisting of the structural units represented by the formula (1), formula (3), or formula (5) accounts for 1 to 15 mol % relative to all structural units, which accounts for 100 mol %, in the resin (A).

6. The photosensitive resin composition as set forth in claim 1, wherein:

$X^1$ to $X^6$ in the formulae (1) to (6) each contain at least one selected from the group consisting of a bisphenol A backbone, biphenyl backbone, hexafluoroisopropylidene backbone, and a residue of an acid anhydride as represented by the following formula (14), or $Y^1$ to $Y^6$ each contain at least one selected from the group consisting of a bisphenol A backbone, biphenyl backbone, hexafluoroisopropylidene backbone, and a residue of a diamine as represented by the following formula (15);

(14)

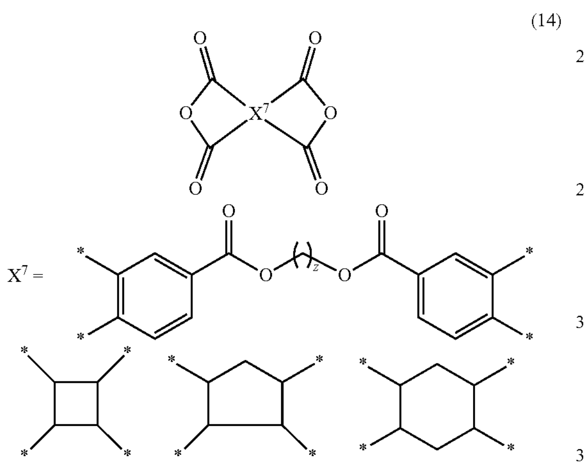

wherein in the formula (14), z denotes an integer of 6 to 20, and * denotes a bonding point, (15)

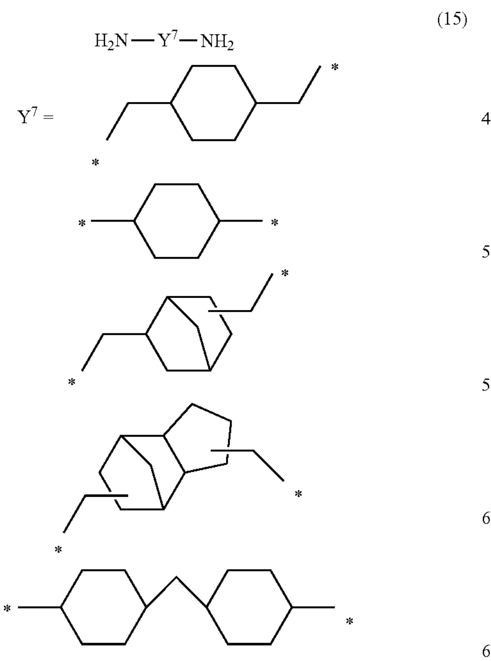

wherein in the formula (15), * denotes a bonding point.

7. The photosensitive resin composition as set forth in claim 1, wherein $Y^1$ to $Y^6$ in the formulae (1) to (6) each contain a residue of a diamine as represented by the following formula (16):

(16)

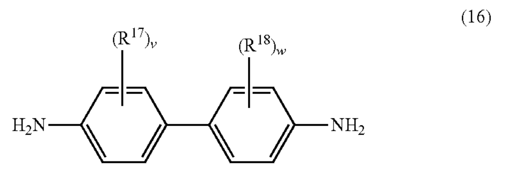

wherein in the formula (16), $R^{17}$'s and $R^{18}$'s each independently denote a group selected from the methyl group, trifluoromethyl group, and hydroxyl group, and v and w each denote an integer of 0 to 4.

8. A photosensitive resin composition comprising a resin (A3) and a photopolymerization initiator (B), the resin (A3) containing one or more structural units represented by any of the following formula (1), formula (3), and formula (5), and the resin further containing one or more structural represented by any of the following formula (2), formula (4), and formula (6):

(1)

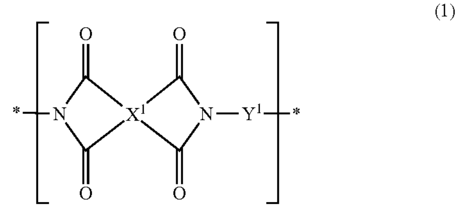

wherein in formula (1), $X^1$ denotes a tetravalent organic group containing 2 to 60 carbon atoms; $Y^1$ denotes a divalent organic group containing 2 to 70 carbon atoms; at least either $X^1$ or $Y^1$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point;

(2)

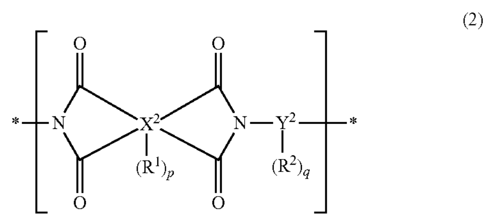

wherein in formula (2), $X^2$ denotes a tetravalent to hexavalent organic group containing 2 to 60 carbon atoms; $Y^2$ denotes a divalent to hexavalent organic group containing 2 to 70 carbon atoms; $R^1$'s and $R^2$'s each independently denote a carboxyl group, a hydroxyl group, or a monovalent organic group containing 3 to 30 carbon atoms and having an ethylenically unsaturated bond; at least one of $R^1$'s and $R^2$'s is a monovalent organic group containing 3 to 30 carbon atoms and having an ethylenically unsaturated bond; p denotes an integer of 0 to 2; q denotes an integer of 0 to 4; the relation 1≤p+q≤6 holds; and * denotes a bonding point;

(3)

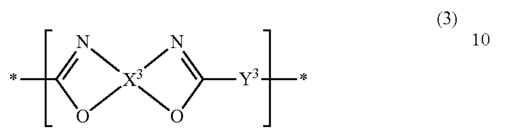

wherein in formula (3), $X^3$ denotes a tetravalent organic group containing 2 to 60 carbon atoms; $Y^3$ denotes a divalent organic group containing 2 to 70 carbon atoms; at least either $X^3$ or $Y^3$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point;

(4)

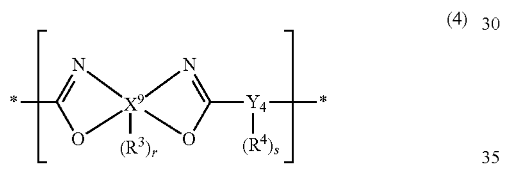

wherein in formula (4), $X^4$ denotes a tetravalent to hexavalent organic group containing 2 to 60 carbon atoms; $Y^4$ denotes a divalent to hexavalent organic group containing 2 to 70 carbon atoms; $R^3$'s and $R^4$'s may be identical to or different from each other and each independently denote a carboxyl group, a hydroxyl group, or a monovalent organic group containing 3 to 30 carbon atoms and having an ethylenically unsaturated bond; at least one of $R^3$'s and $R^4$'s is a monovalent organic group containing 3 to 30 carbon atoms and having an ethylenically unsaturated bond; r denotes an integer of 0 to 2; s denotes an integer of 0 to 4; the relation 1≤r+s≤6 holds, and * denotes a bonding point;

(5)

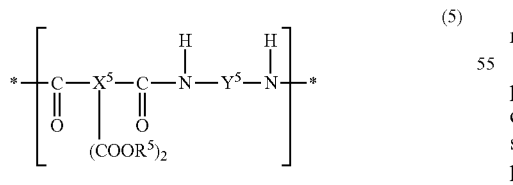

wherein in formula (5), $X^5$ denotes a tetravalent organic group containing 2 to 60 carbon atoms; $Y^5$ denotes a divalent organic group containing 2 to 70 carbon atoms; at least either $X^5$ or $Y^5$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; ($COOR^5$) is a substituent group located at a position where it can form an imide ring with an amide group bonded to $X^5$; $R^5$ denotes a hydrogen atom or an organic group containing 1 to 5 carbon atoms; and * denotes a bonding point;

(6)

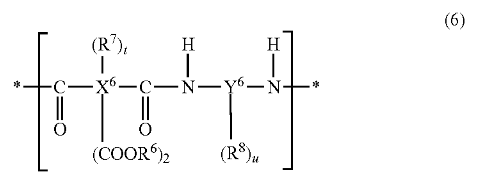

wherein in formula (6), $X^6$ denotes a tetravalent to hexavalent organic group containing 2 to 60 carbon atoms; $Y^6$ denotes a divalent to hexavalent organic group containing 2 to 70 carbon atoms; ($COOR^6$) is a substituent group located at a position where it can form an imide ring with an amide group bonded to $X^6$; $R^6$ is a hydrogen atom or an organic group containing 1 to 5 carbon atoms; $R^7$ is a hydroxyl group or a monovalent organic group containing 3 to 30 carbon atoms and having an ethylenically unsaturated bond; $R^8$ is a carboxyl group, a hydroxyl group, or a monovalent organic group containing 3 to 30 carbon atoms and having an ethylenically unsaturated bond; at least one of $R^7$'s and $R^8$'s contains 3 to 30 carbon atoms and having an ethylenically unsaturated bond; t denotes an integer of 0 to 2; u denotes an integer of 0 to 4; the relation 1≤t+u≤6 holds; and * denotes a bonding point;

wherein at least one of the structural units represented by formula (1), (3), or (5) accounts for 1 to 30 mol % relative to all structural units, which accounts for 100 mol %, in the resin (A3); and wherein a phenolic hydroxyl group accounts for 1 to 25 mol % relative to all structural units, which account for 100 mol %, in the resin (A3).

9. The photosensitive resin composition as set forth in claim 1, further comprising a compound (C) containing two or more ethylenically unsaturated bonds and an alicyclic structure.

10. The photosensitive resin composition as set forth in claim 1, further comprising a heat-crosslinker (D).

11. A photosensitive sheet comprising the photosensitive resin composition as set forth in claim 1, used as a base material.

12. A cured film produced by curing the photosensitive resin composition as set forth in claim 1.

13. A method for producing a cured film by using the photosensitive resin composition as set forth in claim 1, comprising a step for coating a substrate with the photosensitive resin composition or laminating a substrate with the photosensitive sheet and drying it to form a photosensitive resin film, a step for exposing the dried photosensitive resin film to light, a step for developing the light-exposed photosensitive resin film, and a step for heat-treating the developed photosensitive resin film.

14. An electronic component comprising the cured film as set forth in claim 12.

15. An antenna element comprising at least one antenna wiring layer and the cured film as set forth in claim 12, the antenna wiring layer containing at least one or more selected from the group consisting of meander type loop antenna, coil type loop antenna, meander type monopole antenna, meander type dipole antenna, and microstrip antenna, each antenna part in the antenna wiring layer having an exclusive area of 1,000 $mm^2$ or less, and the cured film being an insulating film for insulation between the ground and the antenna wiring layer.

16. A semiconductor package comprising at least a semiconductor element, a redistribution layer, a molding resin layer, and an antenna wiring layer, the antenna wiring layer containing at least one or more selected from the group consisting of meander type loop antenna, coil type loop antenna, meander type monopole antenna, meander type dipole antenna, and microstrip antenna, each antenna part in the antenna wiring layer having an exclusive area of 1,000 $mm^2$ or less; the insulating layer in the redistribution layer and/or the molding resin layer containing the cured film as set forth in claim 12; and the molding resin layer being located between the ground and the antenna wiring layer.

17. An antenna element comprising an antenna wiring layer formed on the cured film as set forth in claim 12, the antenna wiring layer having a height of 50 to 200 μm and the cured film having a thickness of 80 to 300 μm.

18. A display device comprising the cured film as set forth in claim 12.

19. A photosensitive resin composition comprising a resin (A3) and a photopolymerization initiator (B), the resin (A3) containing one or more structural units represented by the following formula (1) or formula (3), and the resin further containing one or more structural units represented by the following formula (2) or formula (4):

(1)

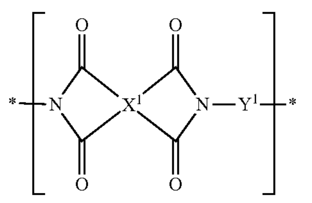

wherein in the formula (1), $X^1$ denotes a tetravalent organic group containing 2 to 60 carbon atoms; $Y^1$ denotes a divalent organic group containing 2 to 70 carbon atoms; at least either $X^1$ or $Y^1$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point, (2)

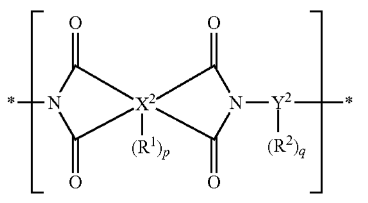

wherein in the formula (2), $X^2$ denotes a tetravalent to hexavalent organic group containing 2 to 60 carbon atoms; $Y^2$ denotes a divalent to hexavalent organic group containing 2 to 70 carbon atoms; $R^1$'s and $R^2$'s each independently denote a carboxyl group, a hydroxyl group, or a monovalent organic group containing 3 to 30 carbon atoms and having an ethylenically unsaturated bond; at least one of $R^1$'s and $R^2$'s is a monovalent organic group containing 3 to 30 carbon atoms and having an ethylenically unsaturated bond; p denotes an integer of 0 to 2; q denotes an integer of 0 to 4; the relation $1 \leq p+q \leq 6$ holds; and * denotes a bonding point, (3)

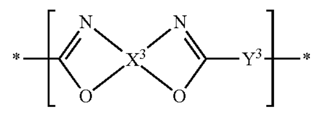

wherein in the formula (3), $X^3$ denotes a tetravalent organic group containing 2 to 60 carbon atoms; $Y^3$ denotes a divalent organic group containing 2 to 70 carbon atoms; at least either $X^3$ or $Y^3$ is a multivalent carboxylic acid residue and/or a multivalent amine residue having an alicyclic hydrocarbon structure that contains 4 to 8 carbon atoms and that may contain an unsaturated bond, with at least four or more hydrogen atoms in the alicyclic hydrocarbon structure being each substituted by a hydrocarbon group that contains 4 to 12 carbon atoms and that may contain an unsaturated bond; and * denotes a bonding point, (4)

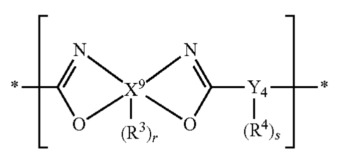

wherein in the formula (4), $X^4$ denotes a tetravalent to hexavalent organic group containing 2 to 60 carbon atoms; $Y^4$ denotes a divalent to hexavalent organic group containing 2 to 70 carbon atoms; $R^3$'s and $R^4$'s may be identical to or different from each other and each independently denote a carboxyl group, a hydroxyl group, or a monovalent organic group containing 3 to 30 carbon atoms and having an ethylenically unsaturated bond; at least one of $R^3$'s and $R^4$'s is a monovalent organic group containing 3 to 30 carbon atoms and having an ethylenically unsaturated bond; r denotes an integer of 0 to 2; s denotes an integer of 0 to 4; the relation $1 \leq r+s \leq 6$ holds, and * denotes a bonding point, and wherein at least one of the structural units represented by formula (1) or (3) accounts for 1 to 30 mol % relative to all structural units, which accounts for 100 mol %, in the resin (A3).

20. The photosensitive resin composition as set forth in claim 19, wherein the structure of the resin (A3) contains a fluorine component.

21. The photosensitive resin composition as set forth in claim 19, wherein a phenolic hydroxyl group accounts for 1 to 25 mol % relative to all structural units, which account for 100 mol %, in the resin (A3).

* * * * *